United States Patent
Bash et al.

(10) Patent No.: US 7,031,154 B2
(45) Date of Patent: Apr. 18, 2006

(54) LOUVERED RACK

(75) Inventors: Cullen Edwin Bash, San Francisco, CA (US); Ratnesh K. Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 126 days.

(21) Appl. No.: 10/425,621

(22) Filed: Apr. 30, 2003

(65) Prior Publication Data

US 2004/0217072 A1    Nov. 4, 2004

(51) Int. Cl.
*H05K 7/20* (2006.01)
(52) U.S. Cl. .................. 361/690; 62/259.2; 236/49.3; 236/49.5; 211/26; 361/694; 361/695; 165/80.3; 700/300

(58) Field of Classification Search ............ 62/259.2; 236/49.3, 49.5; 211/26; 312/265.1–265.6, 312/223.2; 361/600–831; 454/184; 165/80.3, 165/121, 22; 700/276–277, 299, 300
See application file for complete search history.

(56) References Cited

U.S. PATENT DOCUMENTS

| | | | |
|---|---|---|---|
| 5,165,770 A | | 11/1992 | Hahn |
| 5,497,873 A | * | 3/1996 | Hay .............................. 40/564 |
| 5,718,628 A | * | 2/1998 | Nakazato et al. ........... 454/184 |
| 5,769,159 A | * | 6/1998 | Yun ............................. 165/276 |
| 6,185,098 B1 | * | 2/2001 | Benavides ................... 361/695 |
| 6,229,701 B1 | * | 5/2001 | Kung et al. ................. 361/688 |
| 6,775,137 B1 | * | 8/2004 | Chu et al. .................... 361/696 |

* cited by examiner

*Primary Examiner*—Gregory D Thompson
(74) *Attorney, Agent, or Firm*—Richard P. Lange

(57) ABSTRACT

A rack has a frame for supporting one or more electronic components. A front panel and a rear panel are attached to the frame. At least one of the front panel and the rear panel comprises a vent having at least one movable louver configured to vary airflow through the vent.

41 Claims, 13 Drawing Sheets

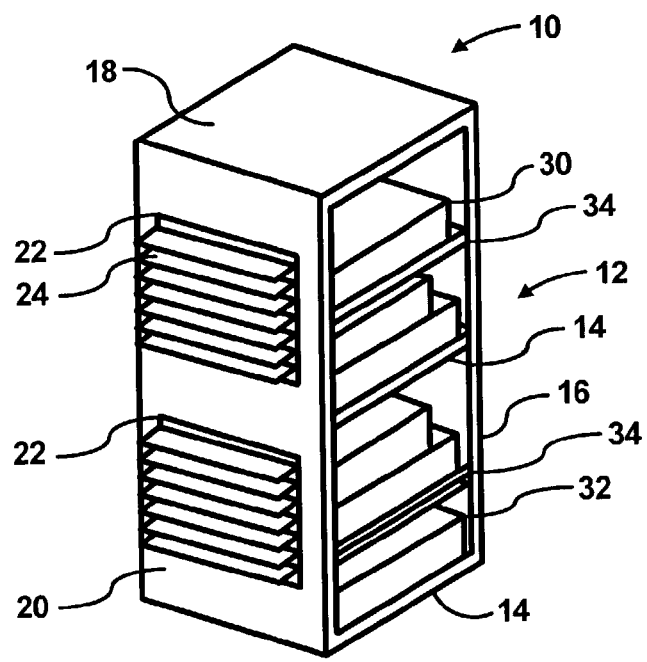
*FIG. 1*
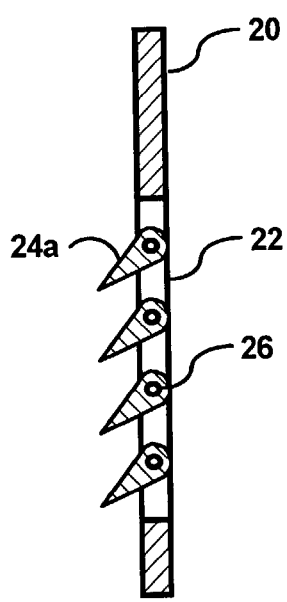
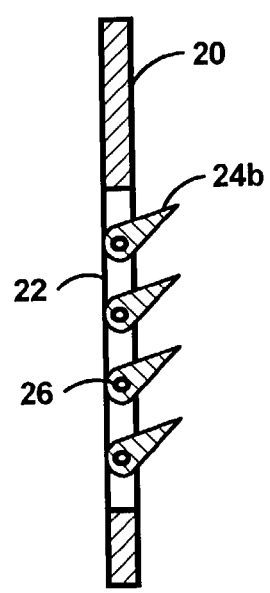
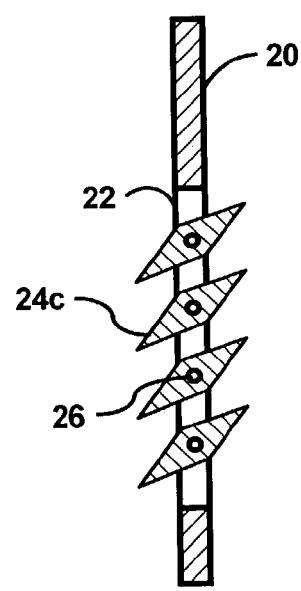
*FIG. 2A*  *FIG. 2B*  *FIG. 2C*

LOUVERED RACK

BACKGROUND OF THE INVENTION

A data center may be defined as a location, e.g., room, that houses computer systems arranged in a number of racks. A standard rack, e.g., electronics cabinet, is defined as an Electronics Industry Association (EIA) enclosure, 78 in. (2 meters) wide, 24 in. (0.61 meter) wide and 30 in. (0.76 meter) deep. These racks are configured to house a number of computer systems, e.g., about forty (40) systems, with future configurations of racks being designed to accommodate up to eighty (80) systems. The computer systems typically include a number of components, e.g., one or more of printed circuit boards (PCBs), mass storage devices, power supplies, processors, micro-controllers, semi-conductor devices, and the like, that may dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, conditioned air, etc., across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more air conditioning units. For example, compressors of air conditioning units typically require a minimum of about thirty (30) percent of the required operating energy to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. For example, air conditioning systems are typically designed around the maximum capacity and redundancies are utilized so that the data center may remain on-line on a substantially continual basis. However, the computer systems in the data center typically utilize around 30–50% of the maximum cooling capacity. In this respect, conventional cooling systems often attempt to cool components that are not operating at a level which may cause their temperatures to exceed a predetermined temperature range. Consequently, conventional cooling systems often incur greater amounts of operating expenses than may be necessary to sufficiently cool the heat generating components contained in the racks of data centers.

Another factor that affects the efficiency of the cooling systems is the level of air re-circulation present in the data center. That is, conventional racks are not designed to reduce mixing of the cooling fluid with heated air. Thus, cooling fluid delivered to the racks mixes with air heated by the components thereby decreasing the effectiveness of the cooling fluid in cooling the components. In addition, heated air mixes with the cooling fluid thereby decreasing the temperature of the air returning to the air conditioning unit and thus the efficiency of the heat transfer at the air conditioning unit.

SUMMARY OF THE INVENTION

According to one embodiment, the present invention pertains to a rack having a frame for supporting one or more electronic components. A front panel and a rear panel are attached to the frame. At least one of the front panel and the rear panel comprises a vent having at least one movable louver configured to vary airflow through the vent.

BRIEF DESCRIPTION OF THE DRAWINGS

Features of the present invention will become apparent to those skilled in the art from the following description with reference to the figures, in which:

FIG. 1 is a perspective view of a rack according to an embodiment of the invention;

FIGS. 2A–2C illustrate cross-sectional side views of a ventilated panel according to various embodiments of the invention;

DETAILED DESCRIPTION OF THE INVENTION

Figure 3A:
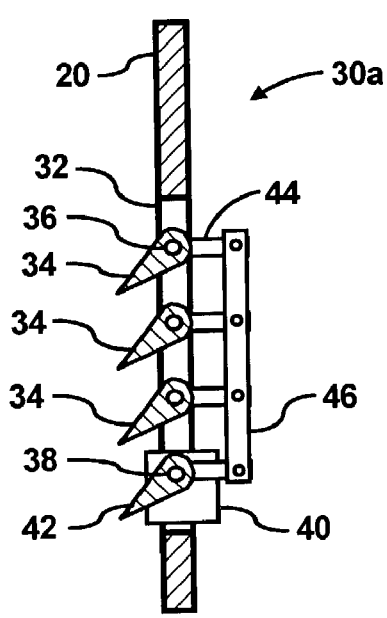
FIGS. 3A–3C are cross-sectional side views of respective louver assemblies for varying the airflow through openings in a ventilated panel, according to various embodiments of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Throughout the present disclosure, reference is made to "cooling fluid" and "heated air". For purposes of simplicity, "cooling fluid" may generally be defined as air that has been cooled by a cooling device, e.g., an air conditioning unit. In addition, "heated air" may generally be defined as air, or cooling fluid, that has been heated, e.g., cooling fluid that has received heat from a heat generating component. It should be readily apparent, however, that the terms "cooling fluid" are not intended to denote air that only contains cooled air and that "heated air" only contains air that has been heated. Instead, embodiments of the invention may operate with air that contains a mixture of heated air and cooling fluid.

According to embodiments of the invention, a rack, e.g., electronics cabinet, designed to house a plurality of heat generating components, e.g., servers, computers, processors, micro-controllers, high speed video cards, memories, semi-conductor devices, and the like, contains a movable louvered vent configured to vary the flow of cooling fluid delivered to the heat generating components. The louvered vent may be actuated to enable control, e.g., magnitude and/or direction, of the cooling fluid delivered to the heat generating components. In this regard, the slats of the louver may be coupled to an actuator designed to manipulate the slats.

In addition or in the alternative, the rack may contain a louvered vent positioned to vary the exhaust of heated air from the rack. In this regard, an actuator may be coupled to the slats of the louver to manipulate their angles. Thus, the magnitude and direction of the exhaust heated air may be controlled with substantial precision.

A controller may be provided to operate the actuator(s) substantially based upon input received from environmental condition sensing devices, e.g., temperature sensors, pressure sensors, humidity detectors, etc.

In one respect, a data center may contain one or more racks having louvered vents. The louvered vents of the racks may be operated in a manner to generally control airflow within the data center. More specifically, the louvered vents may be operated to substantially reduce or eliminate mixing of cooling fluid and heated air in the data center. According to embodiments of the invention, the re-circulation of the cooling fluid and the heated air may be substantially reduced or eliminated by varying one or more of cooling fluid flow into a rack and heated airflow out of the rack. By controlling the re-circulation of the air in the data center, the efficiency of heat transfer from heat generating components to the cooling fluid may be increased. In addition, the efficiency of the heat transfer from the heated air to the cooling device may also be increased. One result is that the amount of energy required to operate cooling systems in the data center may be reduced, thereby reducing the costs associated with operating a data center.

According to further embodiments of the invention, control of the movable louvered vents may substantially be based upon the operation of a smart cooling system. That is, operations of the louvered vents may substantially be based upon, for example, conditions of cooling fluid supplied to the racks. By way of example, the airflow through the louvered vents may substantially be based upon the smart cooling techniques described in co-pending U.S. application Ser. No. 09/970,707, filed on Oct. 5, 2001, which is assigned to the assignee of the present invention and is hereby incorporated by reference in its entirety.

With reference to FIG. 1, there is shown a perspective view of a rack 10 according to an embodiment of the invention. It should be readily apparent to those of ordinary skill in the art that the rack 10 depicted in FIG. 1 represents a generalized illustration and that other components may be added or existing components may be removed or modified without departing from the scope of the invention.

As illustrated in FIG. 1, the rack 10 includes a frame 12 having four sides. The frame 12 includes horizontally extending members 14 and vertically extending members 16. The horizontally extending members 14 and the vertically extending members 16 may be fastened to each other near their extremities. In addition, they may be fastened according to any known suitable manner, e.g., welds, threaded fasteners, rivets, adhesives and the like. The frame 12 may be sized according to industry standards, such as, those described hereinabove. The frame 12 may include additional horizontally and vertically extending members on one or more sides thereof (not shown) to provide a substantially stable structure. A top panel 18 is illustrated as being supported on the frame 12. Although not illustrated in FIG. 1, the rack 10 may include panels on all four of its sides.

A ventilated panel 20 is illustrated as being attached to a front of the frame 12. The ventilated panel 20 may constitute any side of the rack 10. That is, the ventilated panel 20 may comprise either a side of the rack 10 that receives cooling fluid or a side of the rack that exhausts heated air. It should therefore be understood that any of the sides of the rack 10 and the top panel 18 may comprise the ventilated panel 20 without departing from the scope of the invention. By way of example, the rack 10 may be designed to receive cooing fluid through two sides thereof and exhaust heated air through two sides thereof. For purposes of simplicity, and not of limitation, throughout the present disclosure the front of the rack 10 will be described as a side that receives cooling fluid and the rear of the rack 10 will be described as a side that exhausts heated air.

The ventilated panel 20 includes louvered openings 22, or vents, having movable slats 24. The movable slats 24 are designed to control the flow of air, e.g., cooling fluid or heated air, through the openings 22. Although two openings 22 are shown in FIG. 1, any number of louvered openings 22 may be provided on the ventilated panel 20 without departing from the scope of the invention. The configuration and operation of the movable slats 24 is described in greater detail hereinbelow.

As stated hereinabove, the rack 10 generally houses a plurality of heat generating components 30. The heat generating components 30 may comprise a power supply 32 as well as servers, computers, processors, micro-controllers, high speed video cards, memories, semi-conductor devices, and the like. The heat generating components 30 may be supported on rails or shelves 34 attached to the frame 12. In addition, the heat generating components 30 may include temperature sensors, e.g., thermocouples, thermistors, and the like, (not shown) and fans (not shown) configured to increase airflow through the heat generating components 30. The heat generating components 30 may be provided with temperature sensors and/or fans by their manufacturers. Alternatively, the temperature sensors and/or fans may be installed after the heat generating components 30 are manufactured.

Although not illustrated in FIG. 1, the rack 10 may include temperature sensors located at various positions of the rack 10. For example, the rack 10 may include one or more temperature sensors located at the inlet and one or more temperature sensors located at the outlet. The temperature sensors configured to determine the temperature of the cooling fluid entering into the rack 10 and the temperature sensors configured to determine the temperature of the heated air exhausted from the rack 10 may be installed prior to installation of the components 30. In this respect, the rack 10 may be manufactured with these temperature sensors. Alternatively, these temperature sensors may be installed after installation of the components 30.

FIGS. 2A–2C illustrate cross-sectional side views of the ventilated panel 20 according to various embodiments of the invention. It should be readily apparent to those of ordinary skill in the art that the embodiments of the ventilated panel 20 depicted in FIGS. 2A–2C represent generalized illustrations and that other slat configurations may be implemented without departing from the scope of the invention. For example, the slats may comprise generally rectangular or other known configurations. In addition, it should be understood that the number of slats shown in FIGS. 2A–2C is for illustrative purposes only and is not meant to limit the invention in any respect.

As shown in FIGS. 2A–2C, a plurality of slats 24a, 24b, 24c are positioned in the louvered opening 22. The slats 24a, 24b, 24c may be constructed from any suitable structural materials, such as: metal, plastics, resin, composite, or the like. The slats 24a, 24b, 24c are pivotally attached to the sides of the louvered opening 22 along a horizontal axis via respective pivoting members 26. The slats 24a, 24b, 24c may be manipulated into positions between a fully open and a fully closed position by an actuator (not shown). The slats 24a, 24b, 24c are generally configured to vary the volume flow rate of cooling fluid or heated air through the louvered opening 22, depending on the location of the ventilated panel 20. That is, if the ventilated panel 20 is located on a side of the rack 10 configured to receive cooling fluid, the slats 24a, 24b, 24c may be configured to vary the volume flow rate of cooling fluid flowing through the louvered opening 22.

In addition, if the ventilated panel 20 is located on a side of the rack 10 configured to exhaust heated air, the slats 24a, 24b, 24c may vary the flow of heated air through the louvered opening 22. Thus, if the cooling fluid is delivered to the rack 10 in a generally upward direction, the volume flow rate of the cooling fluid entering into the rack 10 may be controlled by varying the angle of the slats 24a, 24b, 24c. For example, the volume flow rate of the cooling fluid may be reduced by turning the slats 24a, 24b, 24c to face a generally upward direction to thus reduce the cooling fluid flow into the rack 10.

The slats 24a, 24b, 24c may also vary the general direction of airflow through the louvered opening 22. The slats 24a, 24b, 24c illustrated in FIGS. 2A–2C are generally positioned to direct airflow in a substantially upward direction.

Figure 3B:
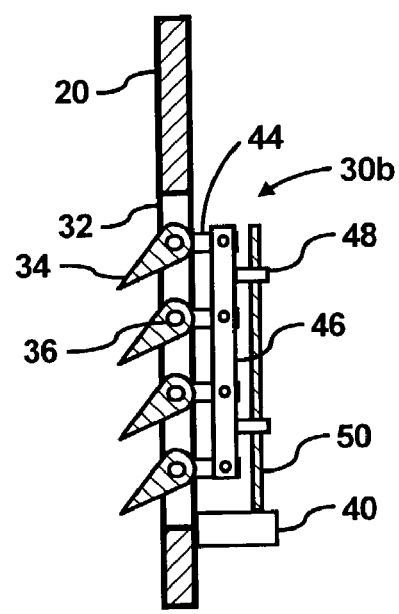
Figure 3C:
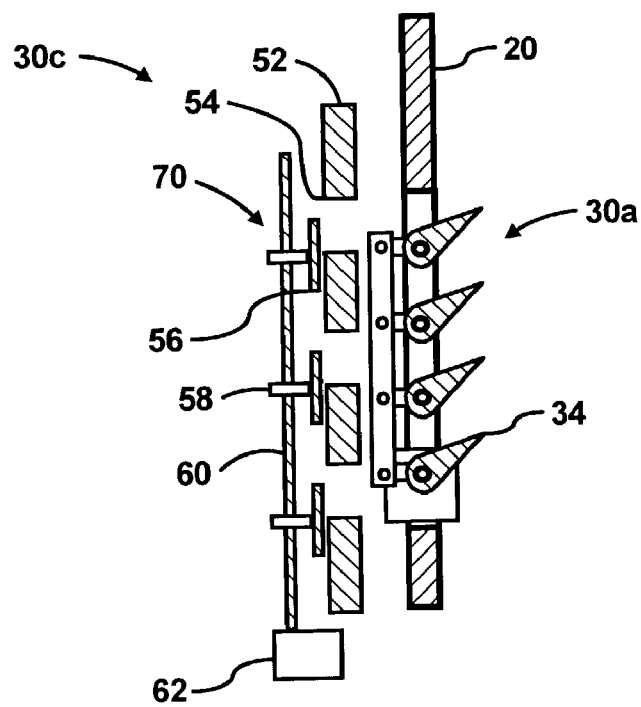

With reference to FIGS. 3A–3C, there are shown cross-sectional side views of respective louver assemblies 30a, 30b, 30c for varying the airflow through openings 32 in a ventilated panel 20, according to various embodiments of the invention. It should be readily apparent to those of ordinary skill in the art that the embodiments of the louver assemblies 30a, 30b, 30c depicted in FIGS. 3A–3C represent generalized illustrations and that other louver assembly configurations may be implemented without departing from the scope of the invention. For example, the louvers may comprise generally rectangular or other known configurations and the actuating devices may comprise a belt driven assembly, geared assembly, or other known mechanisms for moving the louvers. In addition, it should be understood that the number of louvers shown in FIGS. 3A–3C is for illustrative purposes only and is not meant to limit the invention in any respect.

As illustrated in FIG. 3A, the louver assembly 30a is positioned around an opening 32 of the ventilated panel 20. The louver assembly 30a includes slats 34 pivotally attached to the sides of the opening 32 via pivoting members 36. A primary pivoting member 38, e.g., a drive shaft, may be attached and rotated by an actuator 40, e.g., a direct current (DC) motor or the like. The actuator 40 may be rigidly attached to a ventilated panel 20 in any suitable manner. The primary pivoting member 38 may also be rigidly attached to a primary slat 42 configured to rotate as the actuator 40 rotates the primary pivoting member 38. One end of a plurality of linkage members 44 may be rigidly attached to the slats 34 and to the primary slat 42. The other ends of the linkage members 44 may be pivotally attached to a transfer member 46. Thus, rotation of the primary slat 42 causes the transfer bar 46 to translate, thereby causing the slats 34 to pivot about their pivoting members 36.

In FIG. 3B, the louver assembly 30b is illustrated as being located around an opening 32 of the ventilated opening 20. The louver assembly 30b includes slats 34 pivotally attached to the sides of the opening 32 via pivoting members 36. The slats 34 are rigidly connected to ends of linkage members 44. The opposite ends of the linkage members 44 are pivotally attached to a transfer member 46. Attached to the transfer member 46 are drive links 48 having threaded holes (not shown) through which a threaded drive shaft 50 extends. The threaded drive shaft 50 is threadably coupled to the threaded hole of the drive links 48. Thus, rotation of the threaded drive shaft 50 generally causes the drive links 48 to traverse in a direction perpendicular to the threaded drive shaft 50. The threaded drive shaft 50 may be rigidly attached to an actuator 40, e.g., a DC motor or the like. The actuator 40 may thus rotate the threaded drive shaft 50 to generally cause the transfer member 46 to translate thereby causing the slats 34 to rotate about their respective pivoting members 36.

FIG. 3C illustrates a louver assembly 30c designed to provide a greater level of control over the volume flow rate and direction of airflow through the opening 32 in the ventilated panel 20 as compared with the louver assemblies 30a and 30b. As illustrated in FIG. 3C, the louver assembly 30c includes the louver assembly 30a and a venting system 70. Thus, a description of that portion of the louver assembly 30a will not be provided. Instead, the description of the louver assembly 30a is relied upon to provide adequate disclosure of that portion of the louver assembly 30c. It should be understood, however, that the louver assembly 30c may comprise the configuration of the louver assembly 30b to manipulate the slats 34 without departing from the scope of the invention.

The venting system 70 of the louver assembly 30c includes a stationary vane plate 52 comprising a plurality of plate openings 54. The stationary vane plate 52 may be rigidly or removably attached to the ventilated panel 20 to generally enable the slats 34 to rotate relatively freely. In addition, the louver assembly 30c includes a plurality of movable vane plates 56 sized to substantially cover respective plate openings 54. The movable vane plates 56 are illustrated as being rigidly attached to respective drive links 58. The drive links 58 are similar to the drive links described with respect to FIG. 3B. Thus, the drive links 58 include threaded holes not shown through which a threaded drive screw 60 extends. The threaded drive screw 60 is threadably mated with the threaded holes to cause the drive links 50 to translate perpendicularly when the threaded drive screw 60 rotates. The threaded drive screw 60 is coupled to a drive member 62, e.g., a DC motor or the like, such that the drive member 62 may cause rotation of the threaded drive screw 60. Rotation of the drive screw 60 results in translation of the movable vane plates 56 to thereby vary the airflow through the plate openings 54 and through the opening 32 of the ventilated panel 20.

The drive member 62 may be suspended from the stationary vane plate 52 to maintain the sliding relationship between the stationary vane plate 52 and the movable vane plates 56. One of ordinary skill in the art will recognize that the drive member 62 may be suspended by a metal bracket, zip tie, adhesive, or other attachment arrangements (not shown). Although drive links 58 are shown as individually coupling the movable vane plates 56 with the drive screw 60, it is within the purview of the invention that a drive link 58 may be attached to one of the movable vane plates 56 while that movable vane plate 56 is attached to the other movable vane plates 56.

Although the louver assembly 30c is illustrated as comprising the louver assembly 30a, one or more of the ventilated panels 20 of the rack 10 may comprise the venting system 70 without the louver assembly 30a. In this regard, the magnitude of airflow through the ventilated panel 20 may be controlled substantially independently from the control airflow direction through the ventilated panel 20.

According to an embodiment of the invention, the ventilated panel 20 may be retrofitted onto a conventional rack. Thus, for example, a ventilated panel 20 may be positioned on a side of the conventional rack. If necessary, an existing panel of the conventional rack may be removed to provide a space for the ventilated panel 20 to be positioned. In addition, the components for operating the louvers of the ventilated panel 20 as described hereinabove may also be retrofitted onto the conventional rack.

Figure 4A:
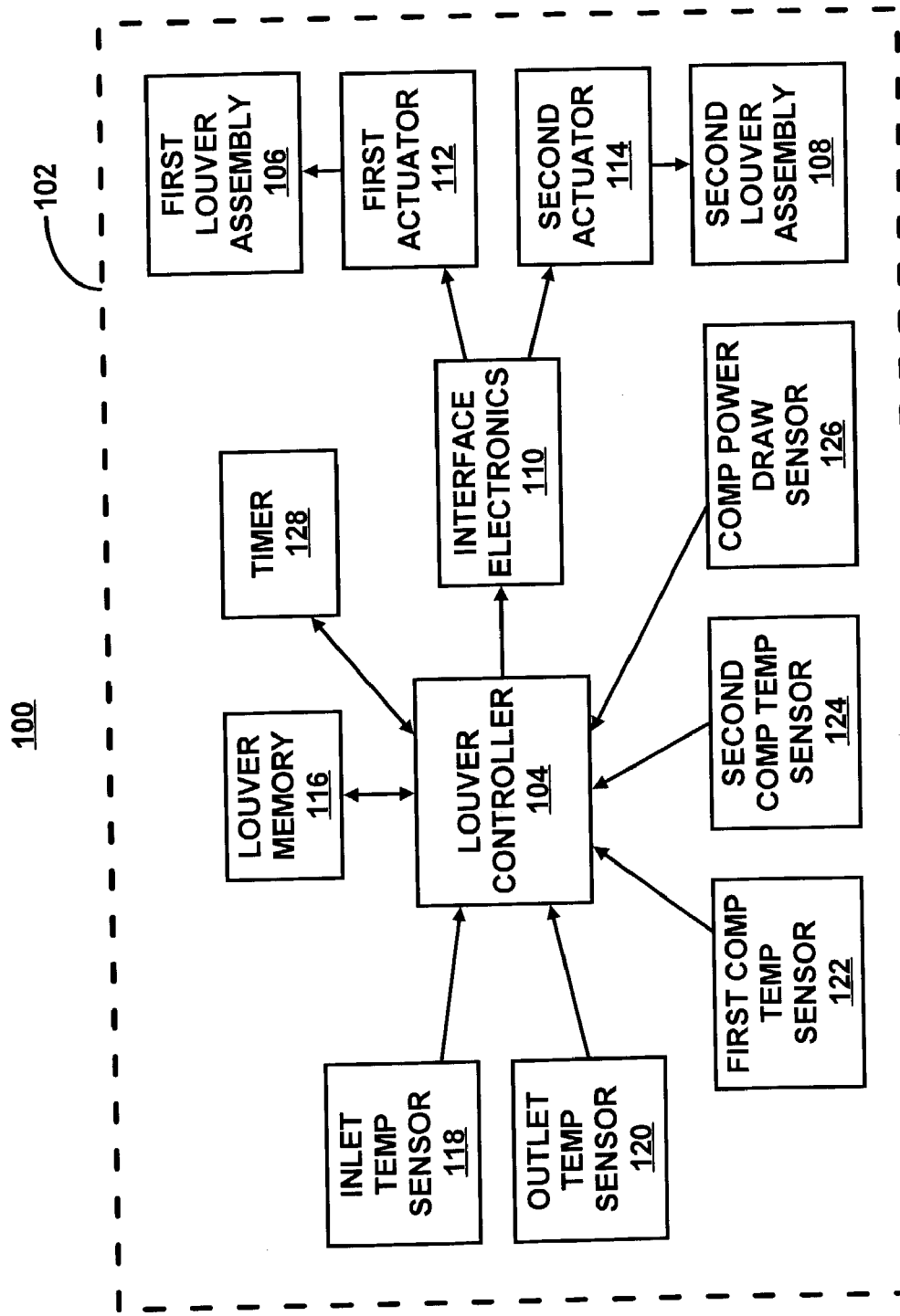
FIG. 4A is an exemplary block diagram for a louver system according to an embodiment of the invention.

FIG. 4A is an exemplary block diagram 100 for a louver system 102 according to an embodiment of the invention. It should be understood that the following description of the block diagram 100 is but one manner of a variety of different manners in which such a louver system 102 may be operated. In addition, it should be understood that the louver system 102 may include additional components and that some of the components described may be removed and/or modified without departing from the scope of the invention.

The louver system 102 includes a louver controller 104 configured to control the operations of one or more louver assemblies, e.g., louver assemblies 30a, 30b, 30c (FIGS. 3A–3C). The louver controller 104 may comprise a microprocessor, a micro-controller, an application specific integrated circuit (ASIC), and the like. The louver controller 104 is generally configured to operate a first louver assembly 106 and a second louver assembly 108. More particularly, the louver controller 104 may be configured to vary the operation of the first louver assembly 106 and the second louver assembly 108 to vary the airflow through a ventilated panel, e.g., ventilated panel 20 (FIG. 1).

Interface electronics 110 may be provided to act as an interface between the louver controller 104 and the actuators for operating the first louver assembly 106 and the second louver assembly 108. The actuator for operating the first louver assembly 106 is illustrated as a first actuator 112. The actuator for operating the second louver assembly 108 is illustrated as a second actuator 114. The first actuator 112 and the second actuator 114 may comprise the actuator 40 of louver assemblies 30a and 30c or they may comprise the drive member 62 of louver assembly 30c. In this regard, the interface electronics 110 may instruct the first actuator 112 and the second actuator 114 to manipulate the first louver assembly 106 and the second louver assembly 108 based upon input from the louver controller 104. By way of example, the interface electronics 110 may vary the supply of voltage to vary the direction and/or magnitude of rotation of a drive shaft of the actuator in accordance with instructions from the louver controller 104.

The louver controller 104 may also be interfaced with a louver memory 116 configured to provide storage of a computer software that provides the functionality of the louver system 102, e.g., the first actuator 112 and the second actuator 114, and may be executed by the louver controller 104. The louver memory 116 may be implemented as a combination of volatile and non-volatile memory, such as DRAM, EEPROM, flash memory, and the like. The louver memory 116 may also be configured to provide a storage for containing data/information pertaining to the manner in which the first actuator 112 and the second actuator 114 may be manipulated in response to, for example, variations in the temperature of the cooling fluid and/or air flow characteristics at an inlet of a ventilated panel.

The louver controller 104 may receive environmental condition information from sensors located in and around the rack 10. An inlet temperature sensor 118, an outlet temperature sensor 120, a first component temperature sensor 122, and a second component temperature sensor 124 may detect and transmit the environmental condition information to the louver controller 104. The inlet temperature sensor 118 may be located around one or more inlets of the louver system 102. In addition, a plurality of inlet temperature sensors may be provided at various locations around the inlet(s). Thus, an inlet temperature sensor 118 may be positioned around the first louver assembly 106 and another inlet temperature sensor 118 may be positioned around the second louver assembly 108. In this regard, the temperatures of the cooling fluid entering through the first louver assembly 106 and the second louver assembly 108 may be substantially individually measured. The transmission of the temperature information may be effectuated through wired connections or through wireless protocols, such as IEEE 801.11b, 801.11g, wireless serial connection, Bluetooth, etc., or combinations thereof.

The first component temperature sensor 122 and the second component temperature sensor 124 may be positioned to respectively detect the temperatures around a first component (not shown) and a second component (not shown) housed in the rack 10. As described hereinabove, the first component temperature sensor 122 and the second component temperature sensor 124 may be provided by the component manufacturers. Alternatively, the first component temperature sensor 122 and the second component temperature sensor 124 may be installed onto manufactured components. In any regard, the louver controller 104 may receive information from the component temperature sensors 122 and 124 through wired connections or through wireless protocols, such as IEEE 801.11b, 801.11g, wireless serial connection, Bluetooth, etc., or combinations thereof. The component temperature sensors 122, 124 may be configured to transmit the temperature information to a rack controller (not shown) that may be in communication with the louver controller 104 through a wired or a wireless connection.

A component power draw sensor 126 may also communicate with the louver controller 104. The component power draw sensor 126 may detect the amount of power being delivered to one or more components in the rack 10. The louver controller 104 may utilize the power draw information to predict the heat generated by the components. Thus, for example, the louver memory 116 may store information correlating the temperatures of the components based upon their power draws. By predicting the temperatures of the components, the louver controller 104 may vary the airflow through one or more of the first and second louver assemblies 106 and 108, to compensate for fluctuating heat generation by the components.

The louver controller 104 further includes a timer 128 configured to track times of various events occurring in the louver system 102. For example, the louver controller 104 may initiate the timer 128 in response to receipt of temperature readings from one or more of the components. In this regard, the louver controller 104 may initiate the timer 128 when a reading is received and may track the time when another reading is received.

Figure 4B:
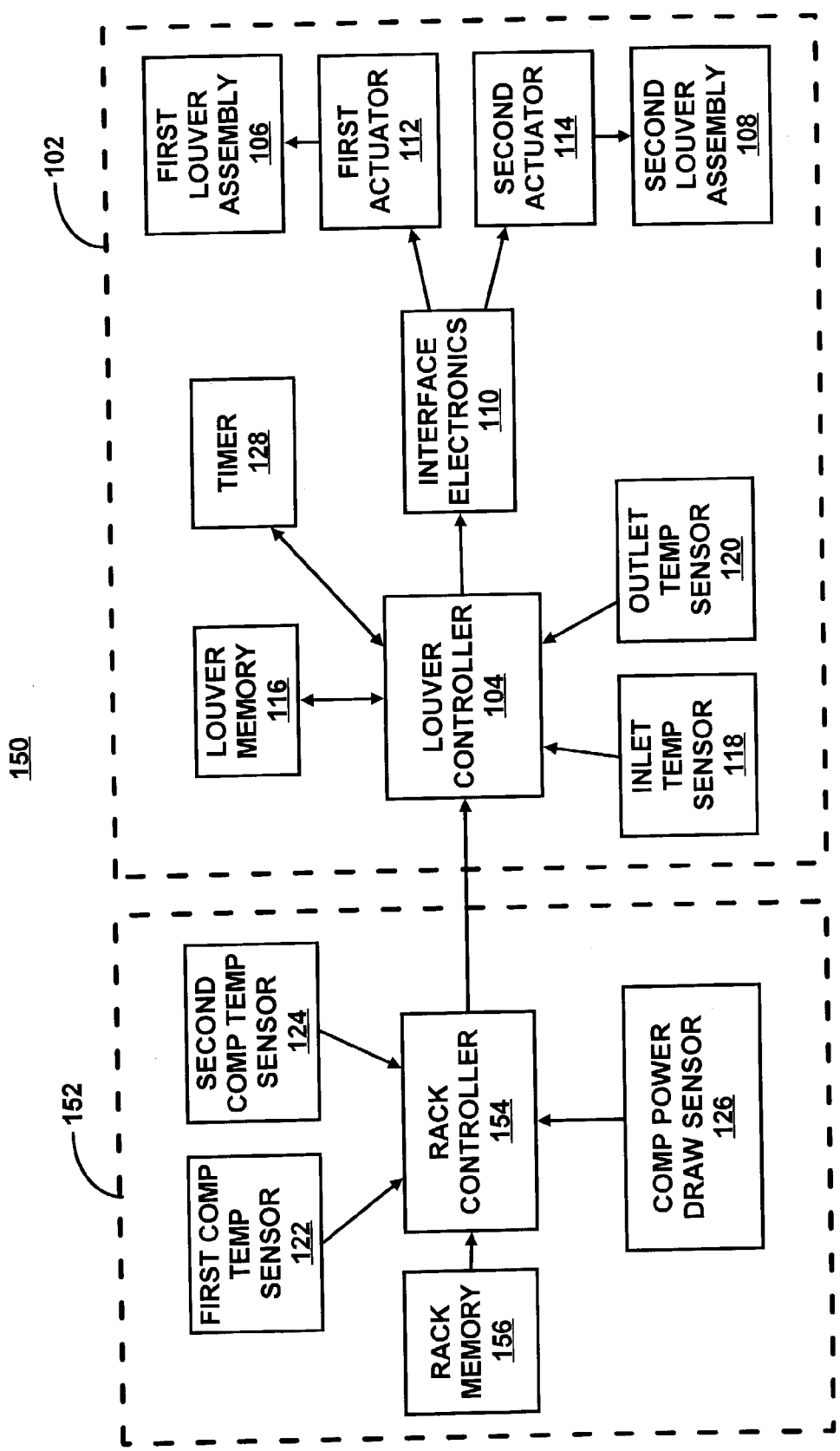
FIG. 4B is an exemplary block diagram for a louver system and a rack system according to an embodiment of the invention.

FIG. 4B is an exemplary block diagram 150 for a louver system 102 and a rack system 152 according to an embodiment of the invention. It should be understood that the following description of the block diagram 150 is but one manner of a variety of different manners in which such a louver system 102 and a rack system 152 may be operated. In addition, it should be understood that the louver system 102 and the rack system 152 may include additional components and that some of the components described may be removed and/or modified without departing from the scope of the invention. For example, the rack system may include additional component temperature sensors as well as other environmental condition sensing devices, e.g., sensors configured to detect humidity, pressure, airflow, etc.

In this embodiment, the louver system 102 comprises the elements described hereinabove with respect to FIG. 4A. However, the first component temperature sensor 122, the second component temperature sensor 124 and the component power sensor 126 are configured to communicate with a rack controller 154. The rack controller 154 is configured to receive information from the sensors 122, 124, 126. The rack controller 154 is also configured to transmit this information to the louver controller 104. In this regard, the rack controller 154 may comprise a microprocessor, a microcontroller, an application specific integrated circuit (ASIC), and the like.

The rack controller 154 may be interfaced with a rack memory 156 configured to provide storage of a computer software that provides the functionality of the rack system 152 and may be executed by the louver controller 104. The rack memory 156 may be implemented as a combination of volatile and non-volatile memory, such as DRAM, EEPROM, flash memory, and the like. The rack memory 156 may also be configured to provide a storage for containing data/information pertaining to components housed within the rack, e.g., rack 10. For example, the rack controller 154 may receive information pertaining to the insertion and removal of components. The rack controller 154 may store this information in the rack memory 156.

According to an embodiment of the invention, the inlet temperature sensor 118, outlet temperature sensor 120, and the louver controller 104 and the rack controller 154 may comprise location aware devices. Location aware devices are described in co-pending application Ser. No. 10/620,272, filed on Jul. 9, 2003, entitled "LOCATION AWARE DEVICES", which is assigned to the assignee of the present invention and the disclosure of which is hereby incorporated by reference in its entirety. As described in that application, these devices are termed "location aware" because they are operable to determine their general locations with respect to other sensors and/or devices and to communicate with one another through wireless communications.

Through use of the location aware devices, the louver controller 104 may determine and store the locations of the various sensors, e.g., inlet temperature sensor 118, outlet temperature sensor 120, etc. The louver controller 104 may thus determine the locations of the first louver assembly 106 and the second louver assembly 108 to thereby operate the first actuator 112 and the second actuator 114 in substantially independent manners. In addition, the louver controller 104 may receive information pertaining to the components housed in the rack 10 along with their locations in the rack 10. Thus, for example, the louver controller 104 may manipulate one or both of the first actuator 112 and the second actuator 114 to supply a greater amount of cooling fluid to those components generating greater amounts of heat.

Figure 5A:
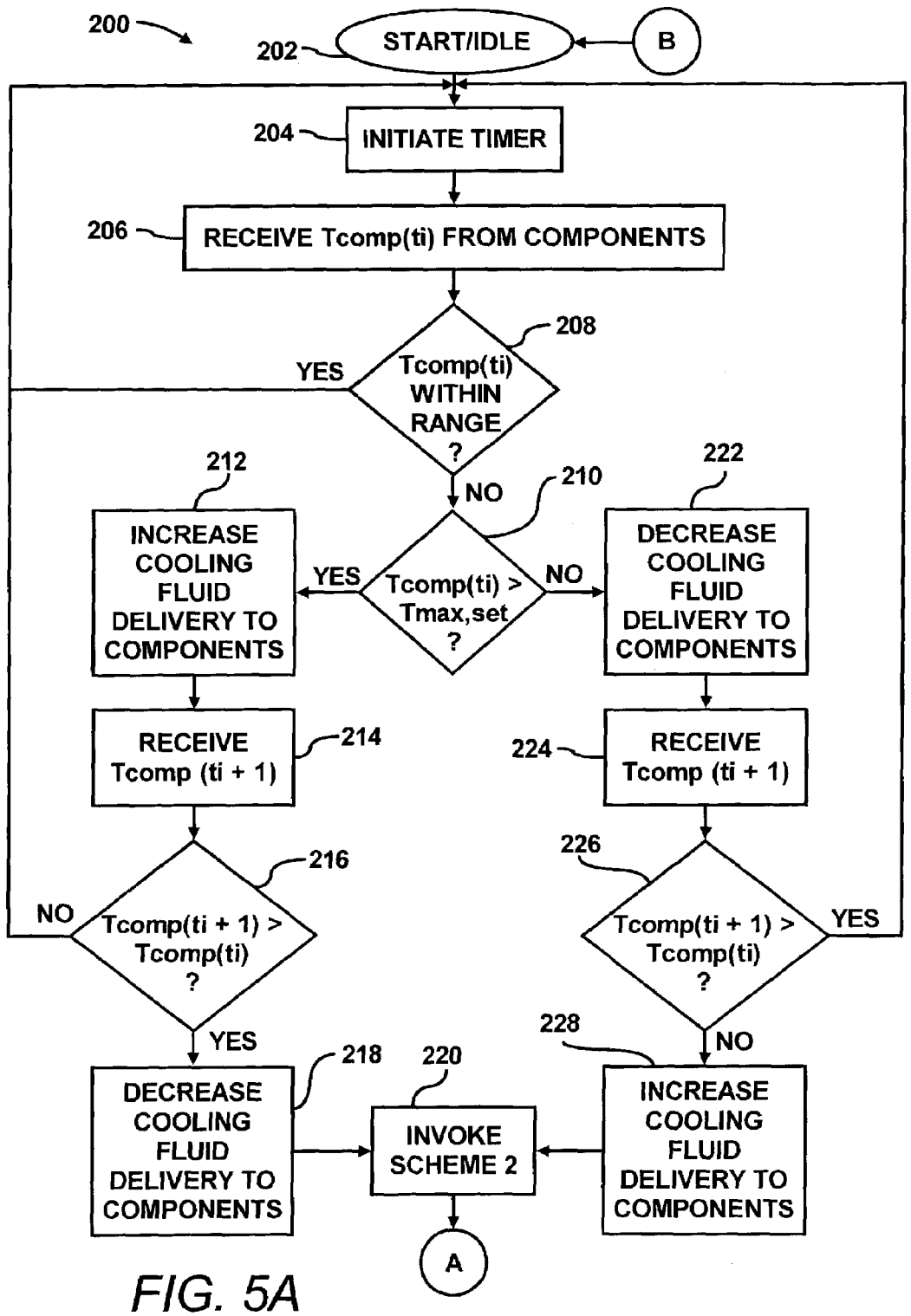
FIGS. 5A and 5B, collectively, illustrate an exemplary flow diagram of an operational mode of a louver system according to an embodiment of the invention.
Figure 5B:
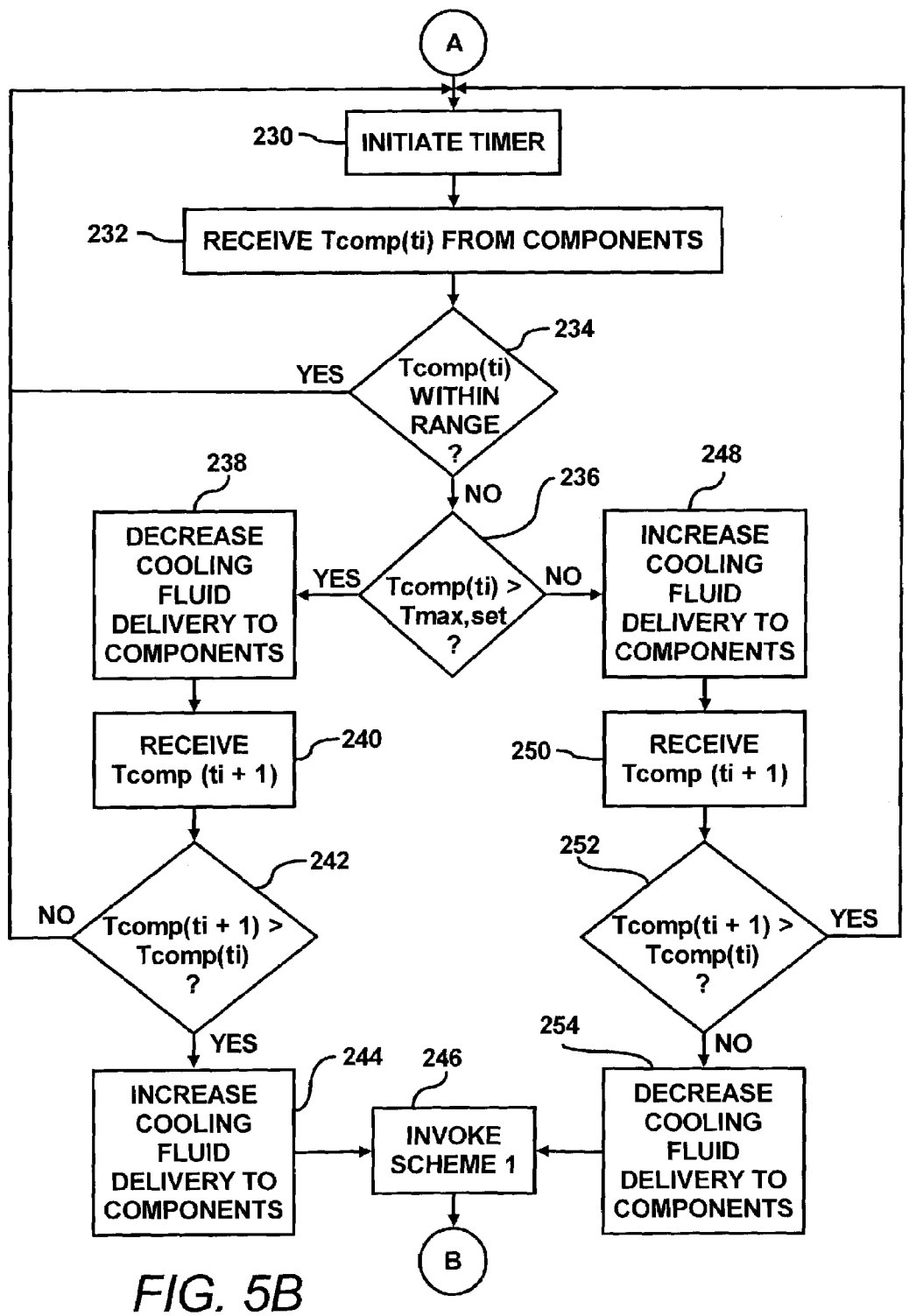

FIGS. 5A and 5B, collectively illustrate an exemplary flow diagram of an operational mode 200 of a louver system 102 according to an embodiment of the invention. It is to be understood that the following description of the operational mode 200 is but one manner of a variety of different manners in which an embodiment of the invention may be operated. It should also be apparent to those of ordinary skill in the art that the operational mode 200 represents a generalized illustration and that other steps may be added or existing steps may be removed or modified without departing from the scope of the invention. The description of the operational mode 200 is made with reference to the block diagram 100 illustrated in FIG. 4A and the block diagram 150 illustrated in FIG. 4B, and thus makes reference to the elements cited therein.

The louver controller 104 may implement the operational mode 200 to control the cooling fluid delivery into the rack 10 and/or the heated airflow exhaust from the rack 10, depending upon the location(s) of the ventilated panel(s) 20. The operational mode 200 may be initiated in response to a variety of stimuli at step 202. For example, the operational mode 200 may be initiated in response to a predetermined lapse of time, in response to receipt of a transmitted signal, and/or in response to a detected change in an environmental condition e.g., (temperature, humidity, location, etc.).

At step 204, the louver controller 104 may initiate a timer, e.g., timer 128. The louver controller 104 may receive temperature information from one or more of the components 30 (Tcomp) at a first time (ti) housed in the rack 10 at step 206. As described hereinabove, temperature sensors 122, 124 of the components may communicate directly with the louver controller 104 (FIG. 4A). Alternatively, the temperature sensors 122, 124 may communicate with a rack controller 154 which may essentially relay the temperature information of the components to the louver controller 104 (FIG. 4B).

The louver controller 104 may determine whether the Tcomp received at the first time (ti) is within predetermined ranges at step 208. The predetermined ranges for the components 30 may be stored in the louver memory 116. The predetermined ranges may be defined as predetermined ranges of operating temperatures for the components 30, e.g., between a maximum set point temperature (Tmax,set) and a minimum set point temperature (Tmin,set). In general, the range of temperatures between Tmin,set and Tmax,set pertains to threshold temperatures that the louver controller 104 may use to determine whether to increase or decrease the flow of cooling fluid delivered to the components. This range of operating temperatures may be set according to a plurality of factors. These factors may include, for example, the operating temperatures set forth by the manufacturers of the components, through testing to determine the optimal operating temperatures, etc. In addition, the predetermined range of operating temperatures may vary from one component to another.

Thus, some of the components 30 may be within their respective predetermined operating ranges whereas other components 30 may be outside their respective predetermined operating ranges. For those components 30 having Tcomp's that are within their predetermined operating ranges, the louver controller 104 may substantially continuously receive temperature information (step 206). For those components 30 having Tcomp's outside their predetermined operating ranges, it is determined whether the Tcomp's are above the Tmax,set for the components 30 at step 210.

If the Tcomp's are above the Tmax,set, then the cooling fluid delivered to those components 30 is increased at step 212. If a ventilated panel 20 is located on a front of the rack 10, the increase in cooling fluid delivery may be accomplished by manipulating the louver assembly 106 to enable a greater mass flow rate of the cooling fluid therethrough. Alternatively, if a ventilated panel 20 is provided on the rear of the rack 10, without a ventilated panel 20 on the front of the ventilated panel 20, the louver assembly 106 may be manipulated to increase the mass flow rate of heated air therethrough. If ventilated panels 20 are provided on the front and the rear of the rack 10, then they may both be manipulated to enable greater airflow through the rack 10.

It has been found that under certain circumstances, the increase in cooling fluid delivered to the components does not always produce the intended effect of reducing their temperatures. Therefore, according to an embodiment of the invention, at step 214, the temperatures of the components may be received at a second time (ti+1). The louver controller 104 may determine whether the increase in cooling fluid delivery to the components (step 212) resulted in a decrease in the component temperatures. Thus, at step 216, the louver controller 104 may compare the Tcomp(ti+1) with the Tcomp(ti) to determine whether the cooling fluid delivery increase resulted in a reduction in the temperatures of the components. If the Tcomp at (ti+1) is less than the Tcomp at (ti), a first scheme (scheme 1) may be invoked by the louver controller 104. According to the first scheme, when the temperatures of the components exceed a predetermined maximum set point temperature, cooling fluid delivery is increased to the components (steps 204–212).

If the temperatures of the components have risen, e.g., Tcomp(ti+1)>Tcomp(ti), the louver controller 104 may decrease the cooling fluid delivery to the components at step 218. In one respect, the rise in component temperatures could indicate that the heated air is circulating with the cooling fluid at a level to cause the cooling fluid temperature to be greater than the Tcomp(ti). In this case, a second scheme (scheme 2) may be invoked as indicated at step 220, which will be described in greater detail hereinbelow.

If the Tcomp(ti) is not greater than the Tmax,set (step 210), which equates to the Tcomp(ti) being less than the Tmin,set, the cooling fluid delivered to the components 30 may be decreased at step 222. Thus, if a ventilated panel 20 is located on a front of the rack 10, the cooling fluid delivered to the components may be decreased by manipulating the louver assembly 106 to decrease the mass flow rate of cooling fluid supplied into the rack 10. Alternatively, if a ventilated panel 20 is provided on the rear of the rack 10, the louver assembly 106 may be manipulated to reduce the flow of heated air therethrough to generally reduce the flow of cooling fluid into the rack 10. If ventilated panels 20 are provided on both the front and the rear of the rack 10, they may both be manipulated to decrease the airflow through the rack 10.

At step 224, the temperatures of the components may be received at a second time (ti+1). The louver controller 104 may determine whether the decrease in cooling fluid delivery to the components (step 222) resulted in an increase in the component temperatures. Thus, at step 226, the louver controller 104 may compare the Tcomp(ti+1) to determine whether the cooling fluid delivery increase resulted in an increase in the temperatures of the components. If the Tcomp at (ti+1) is greater than the Tcomp at (ti), a first scheme (scheme 1) may be invoked by the louver controller 104. According to the first scheme, when the temperatures of the components fall below a predetermined minimum set point temperature, cooling fluid delivery to the components is decreased (steps 204–210 and 222).

If the temperatures of the components have been reduced, e.g., Tcomp(ti+1)<Tcomp(ti), the louver controller 104 may increase the cooling fluid delivery to the components at step 228. In this case, again, the second scheme (scheme 2) may be invoked as indicated at step 220.

In general, according to the second scheme, the louver controller 104 operates in a substantially opposite manner to that of the first scheme. That is, for example, under the second scheme, the louver controller 104 may decrease the cooling fluid delivery to the components in response to the temperatures of the components exceeding the predetermined maximum set point temperature. In addition, the louver controller 104 may increase the cooling fluid delivery to the components in response to the temperatures of the component falling below the predetermined minimum set point temperature.

With reference now to FIG. 5B, the louver controller 104 may initiate the timer at step 230. At step 232, the louver controller 104 may receive the temperatures of the components at some time (ti). This is denoted as Tcomp(ti) in FIG. 5B. The louver controller 104 may determine whether the Tcomp received at the first time (ti) is within their predetermined ranges at step 234. For those components 30 having Tcomp's outside their predetermined operating ranges, it is determined whether the Tcomp's are above the Tmax,set for the components 30 at step 236.

If the Tcomp's are above the Tmax,set, then the cooling fluid delivered to those components 30 is decreased at step 238 in a manner as described hereinabove. At step 240, the temperatures of the components may be received at a second time (ti+1). The louver controller 104 may determine whether the decrease in cooling fluid delivery to the components (step 238) resulted in a decrease in the component temperatures. Thus, at step 242, the louver controller 104 may compare the Tcomp(ti)+1) and the Tcomp(ti) to determine whether the cooling fluid delivery decrease resulted in a reduction in the temperatures of the components. If there was a reduction in component temperatures, e.g., Tcomp(ti+1) is less than the Tcomp(ti), the second scheme (scheme 2) may be repeated by the louver controller 104. According to the second scheme, when the temperatures of the components exceed the predetermined maximum set point temperature, cooling fluid delivery is decreased to the components (steps 230–238).

If the temperatures of the components have risen, e.g., Tcomp(ti+1)>Tcomp(ti), the louver controller 104 may increase the cooling fluid delivery to the components at step 244. In this case, the first scheme (scheme 1) may be invoked as indicated at step 246, as described hereinabove. Thus, the louver controller 104 may enter an idle state indicated as step 202. Alternatively, the louver controller 104 may repeat steps 204–246 on a substantially continuous basis to bring the component temperatures within predetermined operating ranges. According to an embodiment of the invention, the louver controller 104 may prevent the louvers from closing beyond a certain point to thus prevent a situation where the flow of cooling fluid through the rack 10 falls below a preset minimum. In other words, the louver controller 104 may stop the operational mode 200 at a certain point if it determines that the continued reduction in airflow through the rack 10 may result in damage to the components.

If the Tcomp(ti) is not greater than the Tmax,set (step 236), which equates to the Tcomp(ti) being less than the Tmin,set, the cooling fluid delivered to the components 30 may be increased at step 248. At step 250, the temperatures of the components may be received at a second time (ti+1). The louver controller 104 may determine whether the increase in cooling fluid delivery to the components (step 248) resulted in an increase in the component temperatures. Thus, at step 252, the louver controller 104 may compare the Tcomp(ti+1) with the Tcomp(ti) to determine whether the cooling fluid delivery increase resulted in an increase in the temperatures of the components. If there was an increase in component temperatures, e.g., Tcomp(ti+1) exceeds Tcomp(ti), the second scheme (scheme 2) may be repeated by the louver controller 104.

If the temperatures of the components have been decreased, e.g., Tcomp(ti+1)<Tcomp(ti), the louver controller 104 may decrease the cooling fluid delivery to the components at step 254. In this case, again, the first scheme (scheme 1) may be invoked as indicated at step 246.

The first and second schemes may be repeated any number times, e.g., as long as the components 30 are operational, at predetermined time intervals, etc. Thus, the louver controller 104 may vary the cooling fluid delivery into the rack 10 and/or heated air exhaust from the rack 10 as conditions change in the rack 10. In addition, the louver controller 104 may vary the airflow through the rack 10 according to an iterative process. That is, the louver controller 104 may alter the airflow by a predetermined amount each time a change is warranted and repeat this process until the Tcomp's are within the predetermined operating temperature ranges.

In addition, where the ventilated panel 20 contains more than one independently controllable louver assembly, e.g., first louver assembly 106 and second louver assembly 108, the airflow through each of the louver assemblies may be operated in substantially independent manners. Thus, for example, if a component located in an upper portion of the rack 10 has a Tcomp exceeding a Tmax,set and a component located in a lower portion of the rack 10 has a Tcomp below a Tmin,set, the louver assembly supplying cooling fluid to the upper portion of the rack 10 may be manipulated to increase the airflow therethrough and the louver assembly supplying cooling fluid to the lower portion of the rack 10 may be manipulated to decrease the airflow therethrough. In this respect, the cooling fluid may be supplied in substantially independent manners to various portions of the rack 10. In addition, the supply of cooling fluid may be varied according to the amount of heat generated by the components in the various portions of the rack 10.

In one regard, by controlling the cooling fluid delivery to the components on an essentially "as-needed" basis, the amount of energy required to operate the components in the rack 10 may be substantially optimized. In another regard, by generally limiting the cooling fluid flow through the rack 10, the temperature of the heated air returning to an air conditioning unit may be maintained at a relatively high temperature, thus increasing the air conditioning unit's efficiency.

Figure 6:
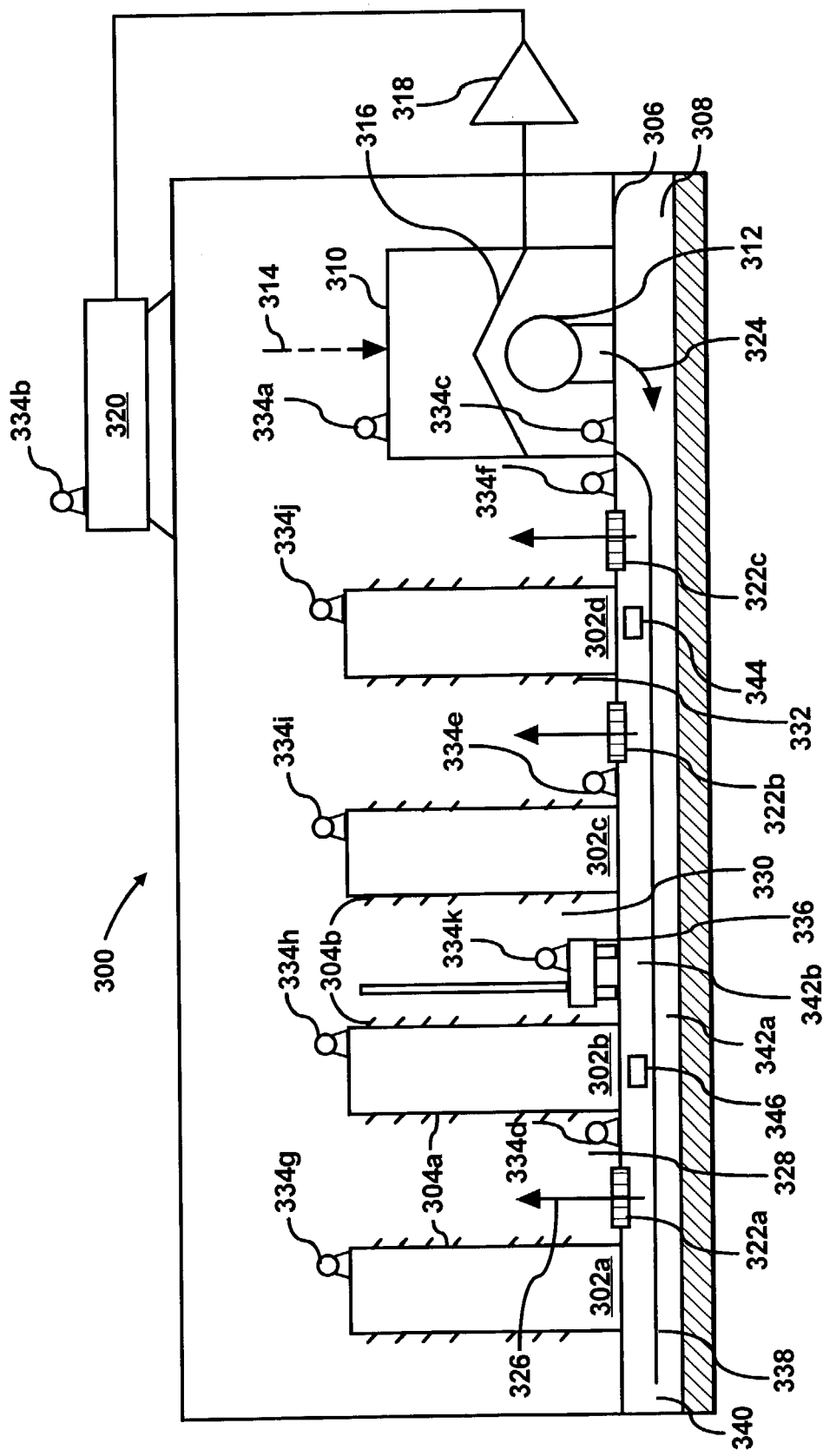
FIG. 6 is a simplified schematic illustration of a data center containing a plurality of racks having one or more ventilated panels, e.g., panels having movable louvers, according to an embodiment of the invention.

FIG. 6 is a simplified schematic illustration of a data center 300 containing a plurality of racks 302a–302d having one or more ventilated panels, e.g., panels having movable louvers 304a, 304b, according to an embodiment of the invention. The use of the terms "data center" throughout the present disclosure are generally meant to denote a room or other space where one or more heat generating components may be situated. In this respect, the terms "data center" are not meant to limit the invention to any specific type of room where data is communicated nor should it be construed that use of the terms "data center" limits the invention in any respect other than its definition hereinabove.

The data center 300 includes a raised floor 306. A plurality of wires and communication lines (not shown) may be located in a space 308 beneath the raised floor 306. In addition, the space 308 may function as a plenum to deliver cooling fluid from an air conditioning unit 310 to the plurality of racks 302a–302d. Although the data center 300 is illustrated in FIG. 6 as containing four racks 302a–302d and an air conditioning unit 310, it should be understood that the data center 300 may include any number of racks, e.g., 100 racks, and air conditioning units 310, e.g., four or more. The depiction of four racks 302a–302d and an air conditioning unit 310 is for illustrative and simplicity of description purposes only and is not intended to limit the invention.

The racks 302a–302d generally house a plurality of heat generating components (not shown), e.g., processors, microcontrollers, high speed video cards, memories, semi-conductor devices, and the like. The components may be elements of a plurality of subsystems (not shown), e.g., computers, servers, etc. The subsystems and the components may be implemented to perform various electronic, e.g., computing, switching, routing, displaying, and the like, functions. Therefore, the subsystems and components may comprise the components 30 described hereinabove. In the performance of these electronic functions, the components, and therefore the subsystems, may generally dissipate relatively large amounts of heat. Because the racks 302a–302d have been generally known to include upwards of forty (40) or more subsystems, they may transfer substantially large amounts of heat to the cooling fluid to maintain the subsystems and the components generally within predetermined operating temperature ranges.

The air conditioning unit 310 includes a fan 312 for supplying cooling fluid (e.g., air) into the space 308 (e.g., plenum) and/or drawing air from the data center 300 (e.g., as indicated by the arrow 314). In operation, the heated air enters into the air conditioning unit 310 as indicated by the arrow 314 and is cooled by operation of a cooling coil 316, a compressor 318, and a condenser 320, in a manner generally known to those of ordinary skill in the art. In terms of cooling system efficiency, it is generally desirable that the return air is composed of the relatively warmest portion of air in the data center 300.

Although reference is made throughout the present disclosure of the use of a fan 312 to draw heated air from the data center 300, it should be understood that any other reasonably suitable manner of air removal may be implemented without departing from the scope of the invention. By way of example, a fan (not shown) separate from the fan 312 or a blower may be utilized to draw air from the data center 300.

In addition, based upon the cooling fluid needed to cool the heat loads in the racks 302a–302d, the air conditioning unit 310 may be operated at various levels. For example, the capacity (e.g., the amount of work exerted on the refrigerant) of the compressor 318 and/or the speed of the fan 312 may be modified to thereby control the temperature and the amount of cooling fluid flow delivered to the racks 302a–302d. In this respect, the compressor 318 may comprise a variable capacity compressor and the fan 312 may comprise a variable speed fan. The compressor 318 may thus be controlled to either increase or decrease the mass flow rate of a refrigerant therethrough. Because the specific type of compressor 318 and fan 312 to be employed with embodiments of the invention may vary according to individual needs, the invention is not limited to any specific type of compressor or fan. Instead, any reasonably suitable type of compressor 318 and fan 312 that are capable of accomplishing certain aspects of the invention may be employed with the embodiments of the invention. The choice of compressor 318 and fan 312 may depend upon a plurality of factors, e.g., cooling requirements, costs, operating expenses, etc.

It should be understood by one of ordinary skill in the art that embodiments of the invention may be operated with constant speed compressors and/or constant speed fans. In one respect, control of cooling fluid delivery to the racks 302a–302d may be effected based upon the pressure of the cooling fluid in the space 308. According to this embodiment, the pressure within the space 308 may be controlled through operation of, for example, a plurality of vents 322a–322c positioned at various locations in the data center 300. That is, the pressure within the space 308 may be kept essentially constant throughout the space 308 by selectively controlling the output of cooling fluid through the vents 322a–322c. By way of example, if the pressure of the cooling fluid in one location of the space 308 exceeds a predetermined level, a vent located substantially near that location may be caused to enable greater cooling fluid flow therethrough to thereby decrease the pressure in that location. A more detailed description of this embodiment may be found in U.S. application Ser. No. 10/303,761 filed on Nov. 26, 2002 and U.S. application Ser. No. 10/351,427 filed on Jan. 27, 2003, which are assigned to the assignee of the present invention and are hereby incorporated by reference in their entireties.

In addition, or as an alternative to the compressor 318, a heat exchanger (not shown) may be implemented in the air conditioning unit 310 to cool the fluid supply. The heat exchanger may comprise a chilled water heat exchanger, a centrifugal chiller (e.g., a chiller manufactured by YORK), and the like, that generally operates to cool air as it passes over the heat exchanger. The heat exchanger may comprise a plurality of air conditioners. The air conditioners may be supplied with water driven by a pump and cooled by a condenser or a cooling tower. The heat exchanger capacity may be varied based upon heat dissipation demands. Thus, the heat exchanger capacity may be decreased where, for example, it is unnecessary to maintain the cooling fluid at a relatively low temperature.

In operation, cooling fluid generally flows from the fan 312 into the space 308 as indicated by the arrow 324. The cooling fluid flows out of the raised floor 306 and into various areas of the racks 302a–302d through a plurality of dynamically controllable vents 322a–322c as indicated by the arrows 326. The vents 322a–322c are termed "dynamically controllable" because they generally operate to control at least one of velocity, volume flow rate and direction of the cooling fluid therethrough. A more detailed description of the dynamically controllable vents 322a–322c may be found in co-pending U.S. application Ser. No. 09/970,707, filed on Oct. 5, 2001, which is assigned to the assignee of the present invention and is incorporated by reference herein in its entirety. In addition, specific examples of dynamically controllable vents 322a–322c may be found in co-pending and commonly assigned U.S. application Ser. No. 10/375,003, filed on Feb. 28, 2003, which is incorporated by reference herein in its entirety.

As the cooling fluid flows out of the vents 322a–322c, the cooling fluid may flow into the racks 302a–302c. The racks 302a–302c may comprise ventilated panels, e.g., ventilated panel 20, having inlet movable louvers 304a as described hereinabove. In addition, the volume flow rate and/or direction of cooling fluid delivered into the racks 302a–302c may be substantially controlled by operation of the inlet movable louvers 326.

In addition, various sections of each of the racks 302a–302d may also receive substantially individualized amounts of cooling fluid. By way of example, if the bottom halves of the racks 302a and 302b are operating at maximum power, thereby dissipating a maximum level of heat load, and the upper halves are operating at little or no power, the vent 322a, may be configured to enable cooling fluid flow therethrough to have a relatively high volume flow rate with a relatively low velocity. In this manner, the cooling fluid may operate to generally supply greater cooling to the lower halves of the racks 302a and 302b, whereas the upper halves may receive relatively lesser amounts of cooling fluid.

In addition, or in the alternative, the inlet movable louvers 304a on the lower halves of the racks 302a and 302b may be manipulated to increase cooling fluid flow therethrough and the inlet movable louvers 304a located on the upper halves of the racks 302a and 302b may be manipulated to decrease cooling fluid flow therethrough.

As the cooling fluid flows through the racks 302a–302d, the cooling fluid may become heated by absorbing heat dissipated from components located in the racks 302a–302d. The heated air may generally exit the racks 302a–302d through ventilated panels having outlet movable louvers 304b. The volume flow rate and/or direction of the heated air exiting the racks 302a–302d may substantially be controlled through operation of the outlet movable louvers 304b.

In keeping with the example above, the outlet movable louvers 304b located on the lower halves of the racks 302a and 302b may be manipulated to increase the flow of heated air therethrough. By increasing the flow of heated air through these outlet movable louvers 304b, the flow of cooling fluid may substantially be increased through the inlet movable louvers 304a located on the lower halves of the racks 302a and 302b. In this regard, the components in the lower halves of the racks 302a and 302b may receive a substantially larger amount of cooling fluid as compared to those components located in the upper halves of the racks 302a and 302b.

The outlet movable louvers 304b located on the upper halves of the racks 302a and 302b may be manipulated to decrease the flow of heated air therethrough. Thus, the flow of cooling fluid may substantially be directed to the components generating relatively larger amounts of heat. In addition, the flow of cooling fluid that has not absorbed heat from the components may generally be reduced. One result is that the temperature exhausted from the racks 302a and 302b may be relatively high to thus enable more efficient air conditioning unit 310 operation.

As another example, if the upper halves of the racks 302c and 302d are operating at approximately 50 percent of their maximum power, and the lower halves are operating at little or no power, the vent 322b may be configured to generally enable cooling fluid flow therethrough to have a relatively low volume flow rate with a relatively high velocity. In this manner, the cooling fluid flow may have sufficient momentum to adequately reach and cool the upper halves of the racks 322c and 322d. In addition, or alternatively, as described hereinabove, the inlet movable louvers 304a located on the upper halves of the racks 322c and 322d may be manipulated to increase the volume flow rate of the cooling fluid therethrough. Also, the inlet movable louvers 304a located on the lower halves of the racks 322c and 322d may be manipulated to decrease the volume flow rate of the cooling fluid therethrough. Moreover, the outlet movable louvers 304b of the racks 322c and 322d may be operated in manners similar to those described above to enable efficient delivery of cooling fluid and exhaust of heated air.

As a further example, the outlet movable louvers 304b may be manipulated to vary the direction of heated air exhausting from the racks 302a–302d. That is, the direction of the heated airflow may be manipulated to flow away from an inlet of a neighboring rack. In one respect, the heated airflow may be directed in a generally upward direction to substantially minimize re-circulation of the heated air with cooling fluid entering the racks 302a–302d through the inlet movable louvers 304a. Thus, the temperature of the cooling fluid entering the racks 302a–302d may substantially equal the temperature of the cooling fluid exiting the vents 322a–322c.

Moreover, as the cooling requirements vary according to the heat loads in the racks 302a–302d, along with the subsequent variations in the volume flow rate of the cooling fluid, the air conditioning unit 310 may also vary the amount of cooling fluid supplied to the racks 302a–302d. As an example, if the heat loads in the racks 302a–302d generally increases, the air conditioning unit 310 may operate to increase one or more of the supply and temperature of the cooling fluid. Alternatively, if the heat loads in the racks 302a–302d generally decreases, the air conditioning unit 310 may operate to decrease one or more of the supply and temperature of the cooling fluid. In this regard, the amount of energy utilized by the air conditioning unit 310 to generally maintain the components in the data center 300 within predetermined operating temperatures may substantially be optimized.

The vents 322a–322c and the movable louvers 304a, 304b thus generally provide localized or zonal control of the cooling fluid flow to the racks 302a–302d. Whereas, the air conditioning unit 310 generally provides global control of the cooling fluid flow. In one respect, by virtue of the zonal and global control of the cooling fluid, the amount of energy consumed by the air conditioning unit 310 in maintaining the components of the racks 302a–302d within predetermined operating temperature ranges may substantially be reduced in comparison with conventional data center cooling systems.

As shown in FIG. 6, the areas between the racks 302a–302d may comprise cool aisles 328, hot aisles 330, or a combination thereof 332. The cool aisles 328 are those aisles that include the vents 322a–322c and thus receive cooling fluid for delivery to the racks 302a–302d. The hot aisles 330 are those aisles that receive air heated by the components in the racks 302a–302d. By substantially separating the cool aisles 328 and the hot aisles 330, the temperature of the cooling fluid delivered to the racks 302a–302d may substantially be prevented from re-circulating with the heated air exhausted from the racks 302a–302d.

FIG. 6 also shows a plurality of location aware devices 334a–334j located throughout the data center 300. As described in co-pending application Ser. No. 10/620,272, the locution aware devices are configured to determine their locations with respect to one another in a substantially autonomous manna. Thus, for example, the locations of the racks 302a–302d may be determined with respect to the vents 322a–322c. In addition, the location aware devices 334a–334j are configured to communicate with each other. By way of example, temperature information from the racks 302a–302d may be communicated to the vents 322a–322c. The vents 322a–322c may be operated to deliver cooling fluid to the racks 302a–302d substantially as needed based upon the received temperature information.

According to another embodiment of the invention, a mobile device 336 may be provided to gather or measure at least one environmental condition (e.g., temperature, pressure, air flow, humidity, location, etc.) in the data center 300. More particularly, the mobile device 336 may be configured to travel around the racks 302a–302d to determine the one or more environmental conditions at various locations throughout the data center 300. A more detailed description of the mobile device 336 and its operability may be found in co-pending U.S. application Ser. No. 10/157,892, filed on May 31, 2002, which is assigned to the assignee of the present invention and is hereby incorporated by reference in its entirety.

As described in the Ser. No. 10/157,892 application, the mobile device 336 may be a self-propelled mechanism configured for motivation around the racks of the data center 300. In addition, the mobile device 336 includes a plurality of sensors configured to detect one or more environmental conditions at various heights. The mobile device 336 may transmit the environmental condition information to an air conditioning unit controller (not shown) which may utilize the information in determining delivery of cooling fluid to various racks located in the data center 300. In addition, the mobile device 336 may transmit the environmental condition information to vent controllers (not shown) configured to operate the vents 322a–322c. Moreover, the mobile device 336 may transmit the environmental condition information to a louver controller. Thus, for example, the mobile device 336 may detect the temperature of the exhaust air from a rack, e.g., rack 302a, and transmit that information to the louver controller of the rack 302a.

The louver controller of the rack 302a may use the received environmental condition information from the mobile device 336 to control the flow of cooling fluid or heated air through the louver assemblies 304a, 304b.

According to another embodiment, the mobile device 336 may receive environmental information from a LAS, e.g., LAS 334a–334j. For example, the LAS may transmit a temperature measurement to the mobile device 336 indicating a hot spot, e.g., a location where the temperature is substantially above normal, in the data center 300. The mobile device 336 may alter its course to travel to the detected hot spot to verify the temperature measurement by the LAS.

Figure 7A:
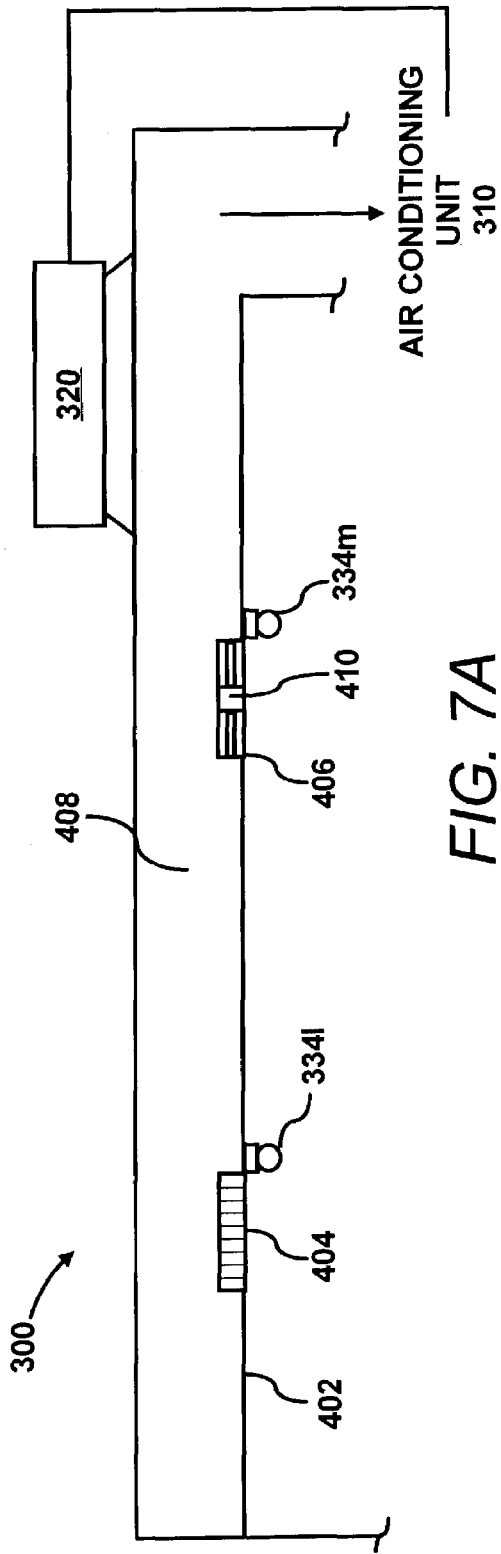
FIG. 7A is a cross-sectional side view of an upper portion of a data center according to an embodiment of the invention.

FIG. 7A is a cross-sectional side view of an upper portion of a data center 300 according to an embodiment of the invention. According to this embodiment, the data center 300 may include a lowered ceiling 402. Dynamically controllable returns 404 and 406 may be situated along the lowered ceiling 402 to generally enable controlled removal of heated air from the data center 300. To facilitate removal of air from the data center 300, the returns 404 and 406 may include a fan 410. A more detailed description of the returns 404 and 406 and manners of their operability may be found in co-pending U.S. application Ser. No. 10/262,879, filed on Oct. 3, 2002, which is assigned to the assignee of the present invention and is hereby incorporated by reference in its entirety.

As described in the Ser. No. 10/262,879 application, a space 408 between the lowered ceiling 402 and the ceiling of the data center 300 may function as a plenum through which air may be returned to the air conditioning unit 310. Through implementation of the dynamically controllable returns 404 and 406, the removal of heated air from the racks 302a–302d may be substantially controlled to minimize mixing of the heated air with the cooling fluid. For example, the returns 404 and 406 may operate to remove greater amounts of heated air when the temperature of the air in their vicinities rises above a predetermined level. In addition, the outlet movable louvers 304b may be configured to direct the flow of heated air exhausted from the racks 302a–302d toward the dynamically controllable returns 404 and 406.

In addition, location aware devices 334l and 334m may be positioned in the vicinities of the returns 404 and 406. In this regard, and as described in the co-pending application Ser. No. 10/620,272, if the locations of the racks 302a–302d change, their locations with respect to the returns 404 and 406 may be tracked without requiring substantial manual input. In addition, through communication between the locution aware devices, the returns 404 and 406 and the racks 302a–302d may be controlled to enable efficient cooling operations, both in terms of energy efficiency and reduction of re-circulation between the cooling fluid and heated air. Moreover, if there is a change in the data center 300 configuration, the movable louvers 304b may be manipulated to deliver heated air to the returns 404 and 406 in a manner to generally reduce re-circulation of the heated air with the cooling fluid. For example, the positions of the movable louvers 304b may be varied to enable a more direct delivery of the heated air to the returns 404 and 406.

Figure 7B:
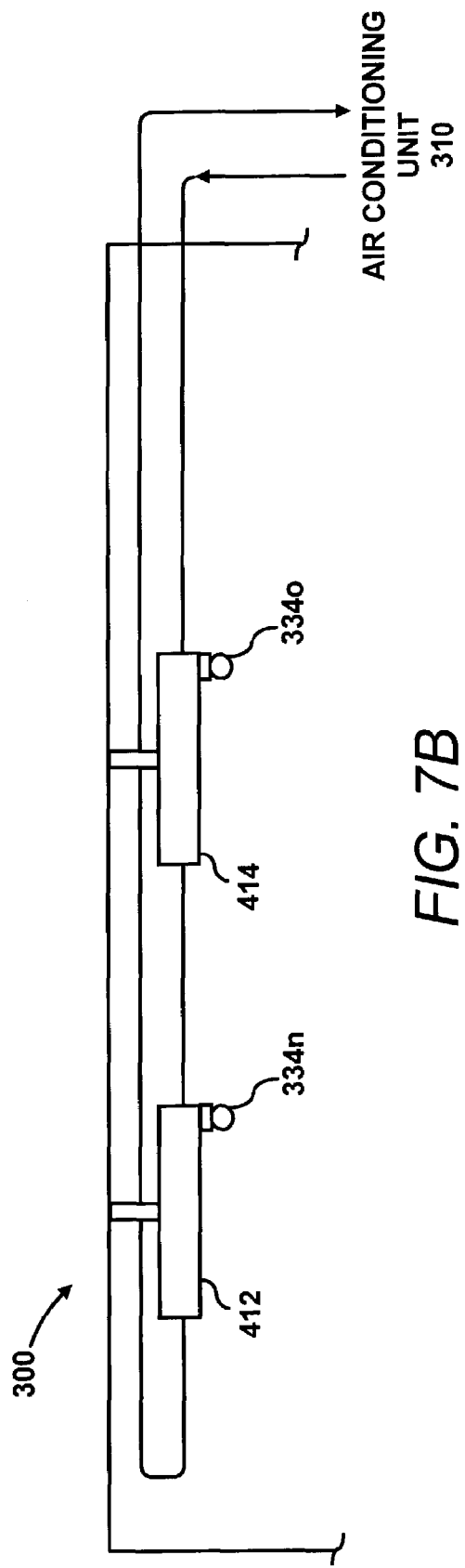
FIG. 7B is a cross-sectional side view of an upper portion of a data center according to a further embodiment of the invention.

FIG. 7B is a cross-sectional side view of an upper portion of a data center 300 according to a further embodiment of the invention. According to this embodiment, heat exchanger units ("HEU") 412 and 414 may be provided in the data center 300. The HEU's 412 and 414 are disclosed and described in co-pending U.S. application Ser. No. 10/210,040, filed on Aug. 2, 2002, which is assigned to the assignee of the present invention and is hereby incorporated by reference in its entirety. As described in the Ser. No. 10/210,040 application, the HEU's 412 and 414 generally operate to receive heated air from the racks 302a–302d, cool the received air, and deliver the cooled air back to the racks 302a–302d in a substantially controlled manner.

According to an embodiment of the invention, the inlet movable louvers 304a may be manipulated to receive cooling fluid from the HEU's 412 and 414. That is, for example, the inlet movable louvers 304a may be positioned to receive the cooling fluid from a direction of the outlets of the HEU's 412 and 414. Thus, in FIG. 6, the inlet movable louvers 304a may be directed in a generally upward direction. In addition, the outlet movable louvers 304b may be manipulated to direct heated airflow toward the inlets of the HEU's 412 and 414. Thus, for example, as configurations within the data center 300 change, e.g., racks are moved or replaced, the inlet of cooling fluid and exhaust of heated air may be substantially optimized to reduce re-circulation of the cooling fluid and heated air.

In addition, location aware devices 334n and 334o may be positioned in the vicinities of the HEU's 412 and 414. In this regard, and as described in the co-pending application Ser. No. 10/620,272, filed on Jul. 9, 2003, entitled "LOCATION AWARE DEVICES", if the locations of the racks 302a–302d change, their locations with respect to the HEU's 412 and 414 may be trucked without requiring substantial manual input. In addition, when there is a change in the data center 300 configuration, the movable louvers 304bmay be manipulated to receive cooling fluid from the HEU's 412 and 414 in a manner to generally reduce re-circulation of the cooling fluid with the heated air. Moreover, the movable louvers 304a may be manipulated to receive cooling fluid from the HEU's 412, 414 and the movable louvers 304b may be manipulated to deliver heated air to the HEU's 412 and 414 in suitable manners to generally reduce re-circulation of the heated air with the cooling fluid.

With reference again to FIG. 6, according to an embodiment of the present invention, the cooling fluid supply for flow through the vents 322a–322c may be maintained at a relatively uniform pressure. In this respect, the space 308 may include a divider 338. The divider 338 may extend substantially along the entire length of space 308, i.e., in the direction generally perpendicular to the plane of FIG. 6. The divider 338 may also extend from the air conditioning unit 310 to substantially the end of the space 308 to thus create a gap 340 between a side edge of the divider 338 and a side surface of the space 308. The divider 338 generally divides the space 308 into two relatively separate chambers 342a and 342b. The first chamber 342a is in fluid communication with the outlet of the fan 312. The second chamber 342b is in fluid communication with the first chamber 342a substantially through the gap 340. In this respect, the cooling fluid flow originating from the fan 312 must travel substantially the entire width of the space 308, i.e., through the first chamber 342a, for the fluid flow to enter into the second chamber 342b.

The cooling fluid in the second chamber 342b may be maintained at a substantially uniform static pressure by virtue of the manner in which the cooling fluid is introduced into the second chamber 342b. The rate at which the cooling fluid is supplied into the first chamber 342a by the fan 312 may cause a relatively large amount of turbulence in the cooling fluid located in the first chamber 342a. The turbulence is generally greatest at the outlet of the fan 312 and generally decreases as the distance from the outlet increases. By virtue of the distance the cooling fluid must travel to enter into the second chamber 342b, the cooling fluid may have substantially stabilized, thus enabling the cooling fluid entering into the second chamber 342b to be relatively calm. In this respect, the divider 338 operates to provide a relatively consistent cooling fluid pressure supply for the vents 322a–322c.

A pressure sensor 344, e.g., a location aware device, may measure the pressure of the cooling fluid located in the second chamber 342b. In this respect, the pressure sensor 344 may detect discernable changes in the pressure of the cooling fluid located within the second chamber 342b and relay that information to a cooling system controller (not shown) and/or to other location aware devices 334a–334o. The cooling system controller may operate to alter the output of the fan 312 in response to the detected changes in pressure. Therefore, operation of the fan 312 may be related to the cooling requirements of the racks 302a–302d and the amount of energy required to supply the racks 302a–302d with cooling fluid may be substantially optimized. In one respect, only that amount of energy required to substantially cool the components contained in the racks 302a–302d may be expended, which may correlate to a substantial energy savings over known cooling systems.

In addition, the vents 322a–322c may receive information from a temperature sensor 346 and the pressure sensor 344. The vents 322a–322c may use this information in controlling the flow of cooling fluid therethrough.

Figure 8:
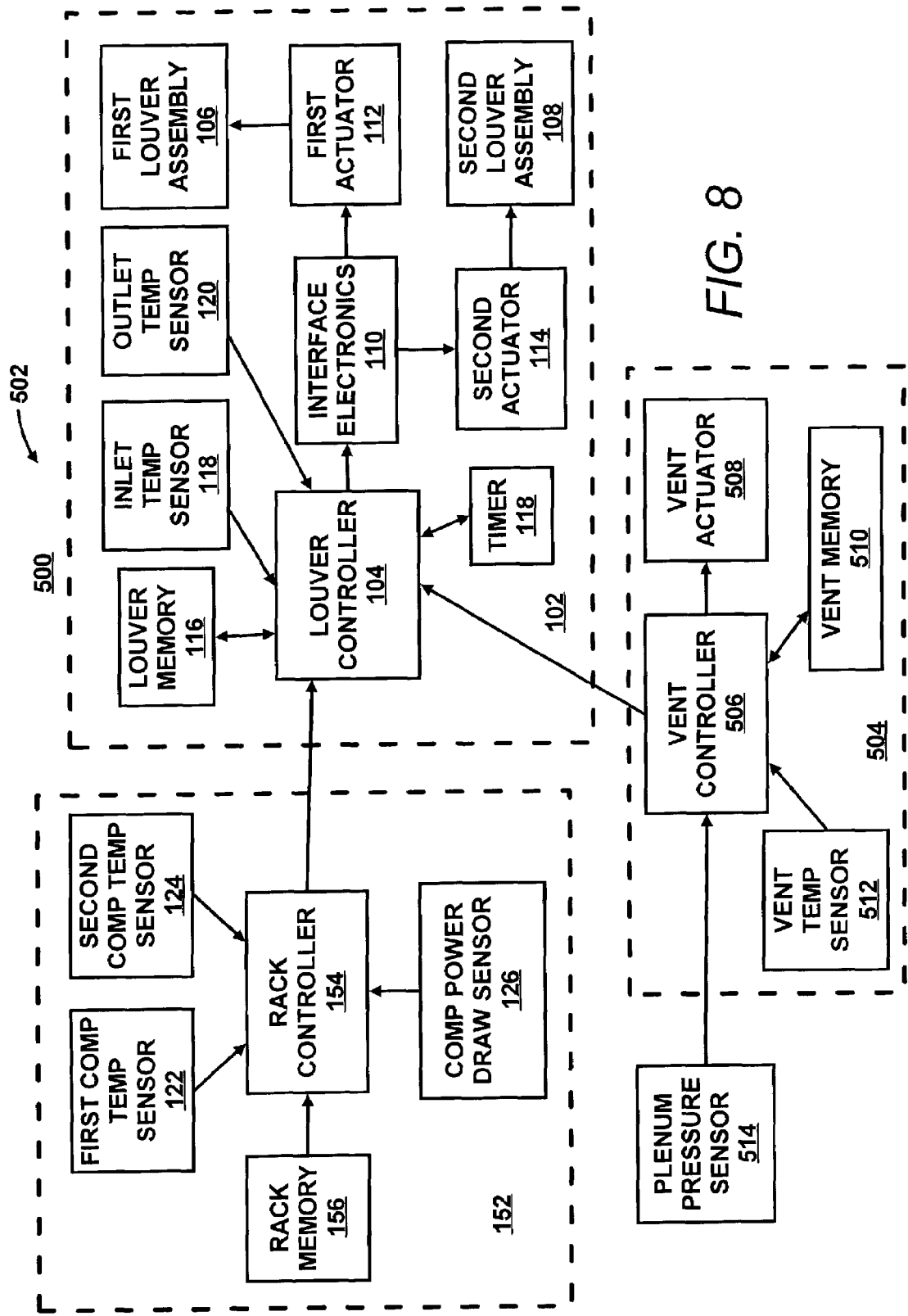
FIG. 8 is an exemplary block diagram for a cooling system according to an embodiment of the invention.

FIG. 8 is an exemplary block diagram 500 for a cooling system 502 according to an embodiment of the invention. It should be understood that the following description of the block diagram 500 is but one manner of a variety of different manners in which such a cooling system 502 may be operated. In addition, it should be understood that the cooling system 502 may include additional components and that some of the components described may be removed and/or modified without departing from the scope of the invention.

The cooling system 502 comprises a louver system 102 (FIG. 4B), a rack system 152 (FIG. 4B), and a vent system 504. A detailed description of the louver system 102 and the rack system 152 will not be set forth below. Instead, the disclosure hereinabove with respect to the louver system 102 and the rack system 152 is relied upon to provide an adequate understanding of these systems.

The vent system 504 includes a vent controller 506 configured to control the operations of a vent. For example, the vent controller 506 may operate a vent actuator 508 to vary at least one of cooling fluid direction and volume flow rate through the vent. The vent may comprise the dynamically controllable vent, e.g., vents 322a–322c (FIG. 6). The vent controller 506 may comprise a microprocessor, a micro-controller, an application specific integrated circuit (ASIC), and the like.

The vent controller 506 may be interfaced with a vent memory 510 configured to provide storage of a computer software that provides the functionality of the vent system 504 and may be executed by the vent controller 506. The vent memory 510 may be implemented as a combination of volatile and non-volatile memory, such as DRAM, EEPROM, flash memory, and the like. The vent memory 510 may also be configured to provide a storage for containing data/information pertaining to the manner in which the vent actuator 508 may be manipulated in response to, for example, variations in the temperature of the cooling fluid and/or pressure within the plenum, e.g., space 308 (FIG. 6).

The vent controller 506 may receive temperature information from a vent temperature sensor 512. The vent temperature sensor 512 may be positioned to detect the temperature of the cooling fluid flowing through the vent. In addition, the vent controller 506 may receive information pertaining to the pressure of the cooling fluid in the plenum from a plenum pressure sensor 514, e.g., pressure sensor 342 (FIG. 6).

Communications between the vent controller 506 and the vent actuator 508, temperature sensor 512, and the plenum pressure sensor S14 may be effectuated through a wired protocol, such as IEEE 802.3, etc., wireless protocols, such as IEEE 801.11b, 801.11g, wireless serial connection, Bluetooth, etc., or combinations thereof. In addition, some or all of the communications may be effectuated through implementation of the location aware devices as described in co-pending U.S. patent application Ser. No. 10/620,272.

The vent controller 506 may also be configured to communicate data/information with the louver controller 104. The communicated data/information may pertain to the pressure of the cooling fluid in the plenum, the temperature of the cooling fluid flowing through the vent, the volume flow rate of the cooling fluid flowing through the vent, and the direction of cooling fluid flow.

A network adapter (not shown) may be provided as an interface between the vent controller 506 and the louver controller 104. In this regard, the network adapter may enable communication via a wired protocol, such as IEEE 802.3, etc., wireless protocols, such as IEEE 801.11b, 801.11g, wireless serial connection, Bluetooth, etc., or combinations thereof. In addition, the location aware devices may be implemented to enable wireless communications between the vent controller 506 and the louver controller 104.

FIGS. 9A–9D, collectively, show an exemplary flow diagram of an operational mode 600 according to an embodiment of the invention. It should be understood that the operational mode 600 may include additional operations and that some of the operations may be removed and/or modified without departing from the scope of the invention. The following description of the operational mode 600 is made with reference to the block diagram 500 illustrated in FIG. 8, and thus makes reference to the elements cited therein.

The operations illustrated in the operational mode 600 may be contained as a utility, program, or a subprogram, in any desired computer accessible medium. In addition, the operational mode 600 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

The operational mode 600 may be implemented to operate a cooling system 502 to control environmental conditions within a data center, e.g., data center 300. The operational mode 600 may be initiated in response to a variety of stimuli at step 602. For example, the operational mode 600 may be initiated in response to a predetermined lapse of time, in response to receipt of a transmitted signal, and/or in response to a detected change in an environmental condition (e.g., temperature, humidity, location, etc.).

At step 604, the louver controller 104 may initiate a timer, e.g., timer 128. The louver controller 104 may receive temperature information from one or more of the components 30 (Tcomp) at a first time (ti) housed in the rack 10 at step 606. As described hereinabove, temperature sensors 122, 124 of the components may communicate directly with the louver controller 104 (FIG. 4A). Alternatively, the temperature sensors 122, 124 may communicate with a rack controller 154 which may essentially relay the temperature information of the components to the louver controller 104 (FIG. 4B).

At step 608, the louver controller 104 may receive information from the vent controller 506. This information may pertain to the pressure of the cooling fluid in the plenum, the temperature of the cooling fluid flowing through the vent, the volume flow rate of the cooling fluid flowing through the vent, and the direction of cooling fluid flow. In addition, the louver controller 104 may receive information from the rack controller 154. This information may pertain to the measured temperatures of one or more components and the power draw to the components in the rack.

At step 610, the louver controller 104 may determine the mass flow rate of airflow through the rack. The mass flow rate of the airflow may be determined based upon the following formula:

$$m_r = Q/Cp(T_{out} - T_{in}))$$

where:

$m_r$ is the mass flow rate through the rack;

Q is the power draw to the components in the rack;

Cp is the specific heat capacity;

$T_{out}$ is the outlet temperature; and $T_{in}$ is the inlet temperature.

Alternatively, one or more sensors may measure the mass flow rate of airflow through the rack. The mass flow rate sensor(s) may transmit the detected airflow mass flow rate to the louver controller 104. In addition, mass flow rate sensor(s) may be positioned at an inlet and an outlet of the rack.

At step 612, the louver controller 104 may substantially concurrently with step 610, determine the mass flow rate of the cooling fluid flow through the vent $m_v$. The $m_v$ may be defined as a function of the vent setting, e.g., the percent open of the vent based upon the vent actuator 508, and the pressure in the plenum. The mass flow rates for various plenum pressures and vent settings may be stored in the vent memory 510, for example, as a look-up table (not shown). The look-up table may include correlations between the plenum pressures, the vent settings and mass flow rates.

Thus, based upon the plenum pressure detected by the plenum pressure sensor 5 14 and the vent setting related to the vent actuator 508, the vent controller 506 may determine the mass flow rate of the cooling fluid flow through the vent. The vent controller 506 may communicate this information to the louver controller 104. Alternatively, the louver memory 116 may store the look-up table and the louver controller 104 may access the look-up table to determine the mass flow rate of the cooling fluid flow through the vent based upon information received from the vent controller 506.

As a further alternative, one or more sensors may measure the mass flow rate of airflow through the vent. The mass flow rate sensor(s) may transmit the detected airflow mass flow rate to the vent controller 506.

The louver controller 104 may compare the mass flow rate through the rack with the mass flow rate through the vent at step 614. In performing step 614, the louver controller 104 may utilize a conversion factor in comparing the mass flow rates of airflow through the rack and the vent. The conversion factor may be based on a plurality of factors, e.g., power supplied to the components, temperature of the components, the degree to which the louvers are open, etc., and may be based upon a substantially optimal mass flow rate difference that reduces or eliminates re-circulation of cooling fluid with heated air. For example, the louver controller 104 may determine that based upon the plurality of factors, the substantially optimal mass flow rate difference occurs when there is twice as much airflow through the vent than the rack. This may occur, for example, when the vent supplies cooling fluid to more than one rack.

Thus, at step 616, the louver controller 104 may establish the conversion factor in comparing the mass flow rates. More particularly, the conversion factor is depicted as some number X times the mass flow rate through the rack and some number Y times the mass flow rate through the vent. In the example above, a substantially optimal difference in mass flow rates may occur when X=2 and Y=1. It should be understood that in certain situations, the substantially optimal mass flow rates may be achieved when the mass flow rates are substantially equal.

If X times the mass flow rate through the rack equals Y times the mass flow rate through the vent, steps 604–616 may be repeated. Alternatively, the louver controller 104 may enter an idle state (step 600) and may re-initiate steps 604–616 in response to the variety of stimuli described hereinabove.

If X times the mass flow rate through the rack does not equal Y times the mass flow rate through the vent, the louver controller 104 may determine whether X times the mass flow rate through the rack ($m_r$) is greater than Y times the mass flow rate through the vent ($m_v$) at step 618. If X times the mass flow rate through the rack is not greater than Y times the mass flow rate through the vent, the louver controller 104 may operate an actuator, e.g., first actuator 112, to increase the airflow through the rack, at step 622. It should be understood, based upon the disclosure above, that the actuator may operate a louver located on either or both of a front and a rear of the rack to increase the airflow through the rack.

If X times the mass flow rate through the rack is greater than Y times the mass flow rate through the vent, the louver controller 104 may determine whether the temperatures of the components (Tcomp) is less than a maximum set point temperature (Tmax,set) at step 620. Again, as described hereinabove, the maximum set point temperature for the various components in the rack may vary from one another. In addition, the maximum set point temperature for the various components may be stored in the louver memory 116. Alternatively, the Tmax,set may be a maximum aggregate temperature of the components in the rack. Therefore, the Tmax,set may relate to a maximum temperature of the rack.

If the temperatures of the components (Tcomp(ti)) above the maximum set point temperature, i.e., Tcomp(ti) exceeds Tmax,set, the louver controller 104 may operate the actuator to increase the airflow through the louver as indicated at step 622.

If the Tcomp(ti) is below Tmax,set, the louver controller 104 may operate an actuator, e.g., first actuator 112, to decrease the airflow through the louver, at step 624. It should be understood, based upon the disclosure above, that the actuator may operate a louver located on either or both of a front and a rear of the rack to decrease the airflow through the rack.

Figure 9A:
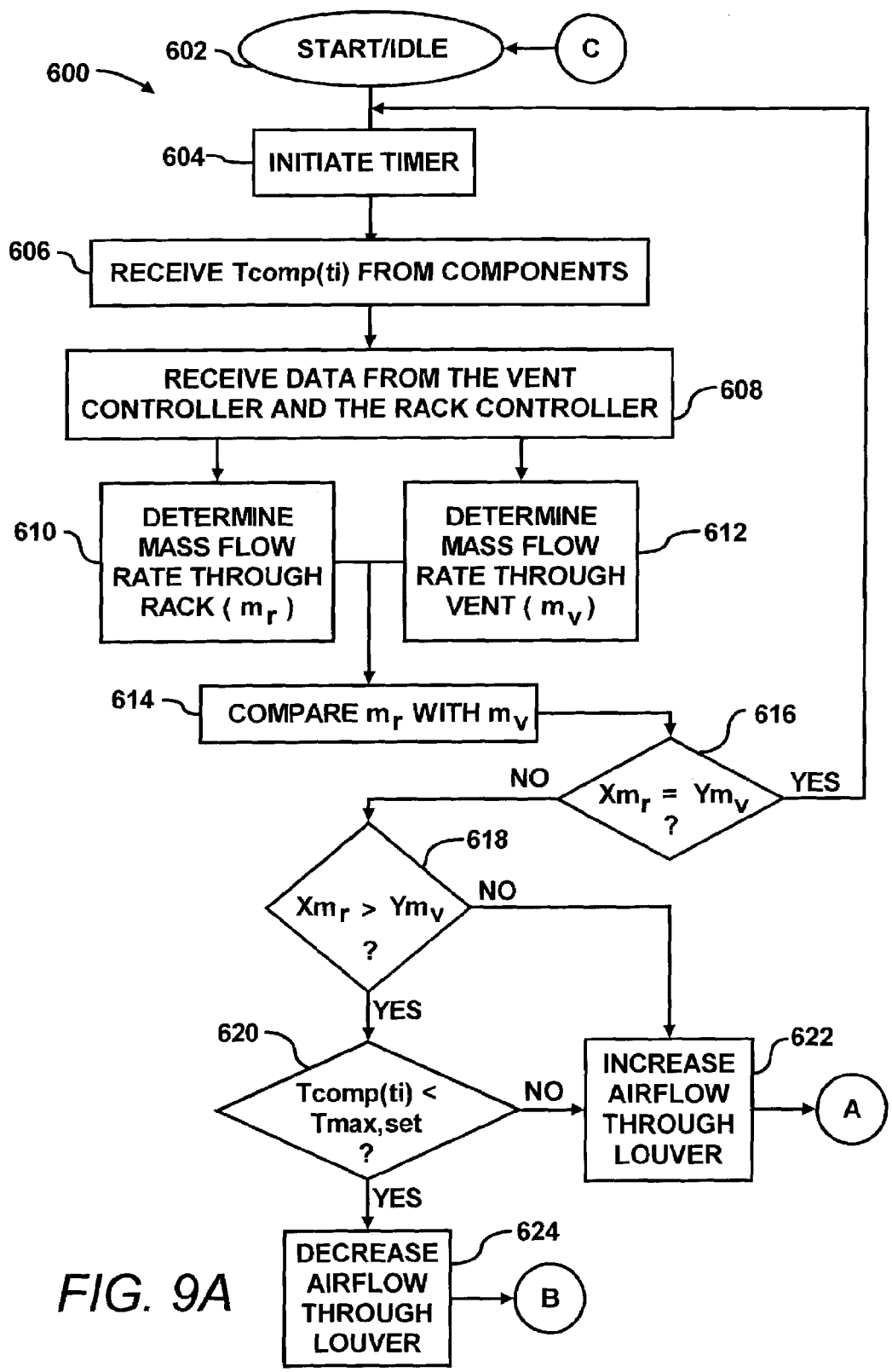
FIGS. 9A–9D, collectively, show an exemplary flow diagram of an operational mode according to an embodiment of the invention.
Figure 9B:
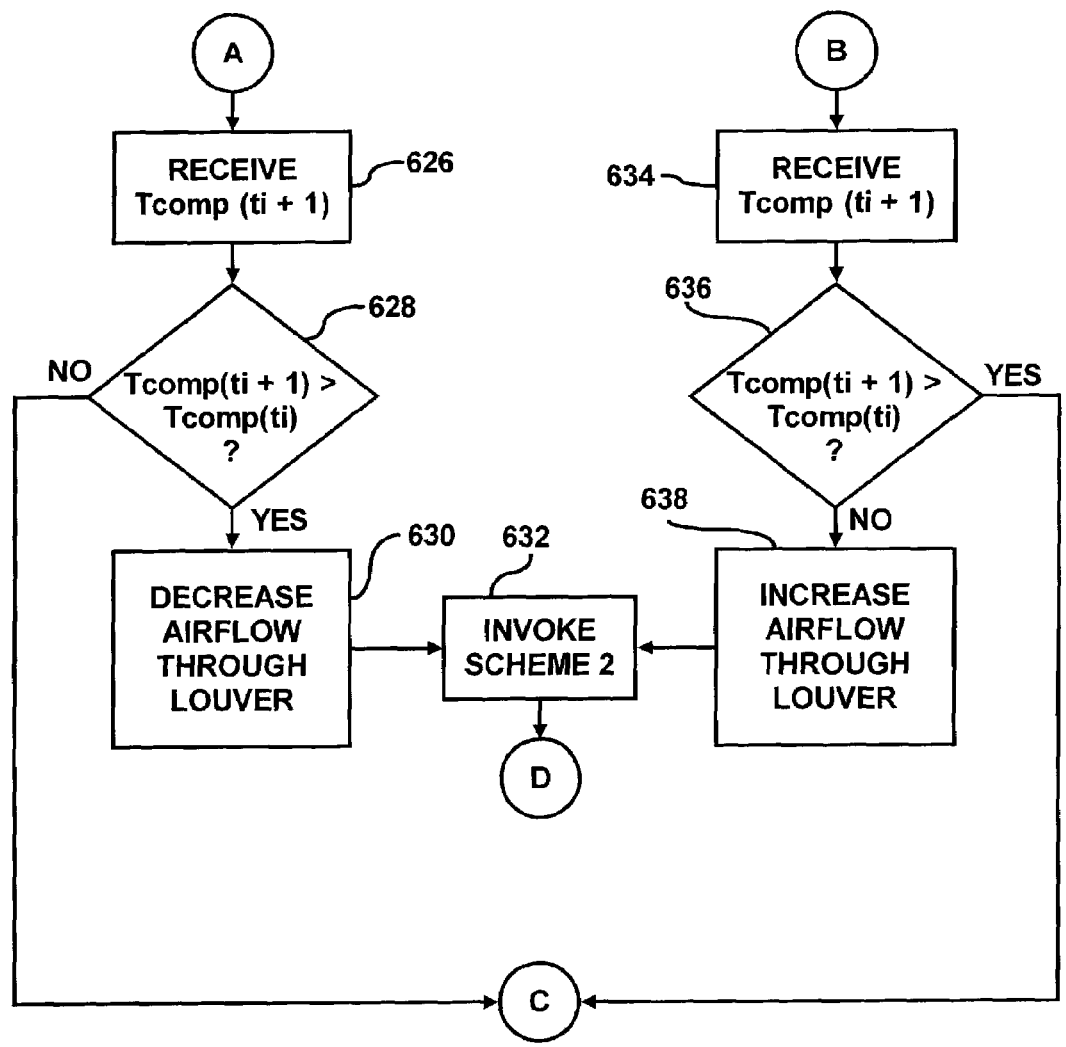

As described above, there may be situations where the increase in airflow delivered to the components, e.g., through manipulation of the louvers, does not always produce the intended change in component temperatures. Therefore, according to an embodiment of the invention, following step 622, the temperatures of the components may be received at a second time (ti+1) at step 626 (FIG. 9B). The louver controller 104 may determine whether the increase in airflow through the louver resulted in a decrease in the component temperatures at step 628. This determination may be made by comparing Tcomp(ti+1) with Tcomp(ti). That is, the controller 104 may determine that the component temperatures rose if Tcomp(ti+1) exceeds Tcomp(ti). If the intended result of reducing the component temperatures occurred, e.g., Tcomp(ti+1) is less than Tcomp(ti), then the first control scheme (scheme 1) indicated as steps 602–624 may be repeated. According to the first control scheme, when the temperatures of the components exceed a predetermined maximum set point temperature, cooling fluid delivery is increased to the components (steps 602–622).

However, if the component temperatures have risen, e.g., Tcomp(ti+1) exceeds Tcomp(ti), the louver controller 104 may decrease the airflow through the louver at step 630. Instead of operating under scheme 1, the louver controller 104 may operate under a second scheme (scheme 2) as indicated at step 632, which will be described in greater detail hereinbelow.

Following step 624, the temperatures of the components may be received at a second time (ti+1) at step 634. The louver controller 104 may determine whether the decrease in airflow through the louver (step 624) resulted in an increase in the component temperatures at step 636. In this respect, the louver controller 104 may compare the Tcomp(ti+1) with the Tcomp(ti) to determine whether the cooling fluid delivery decrease resulted in an increase in the temperatures of the components. If the Tcomp at (ti+1) is greater than the Tcomp at (ti), the first scheme (scheme 1) may be invoked by the louver controller 104.

If the temperatures of the components have been reduced, e.g., Tcomp(ti+1)<Tcomp(ti), the louver controller 104 may increase the airflow through the louver at step 638. In this case, again, the second scheme (scheme 2) may be invoked as indicated at step 632.

In general, according to the second scheme, the louver controller 104 operates in a substantially opposite manner to that of the first scheme. That is, for example, under the second scheme, the louver controller 104 may decrease the cooling fluid delivery to the components in response to the temperatures of the components exceeding the predetermined maximum set point temperature. In addition, the louver controller 104 may increase the cooling fluid delivery to the components in response to the temperatures of the component falling below the predetermined minimum set point temperature.

Figure 9C:
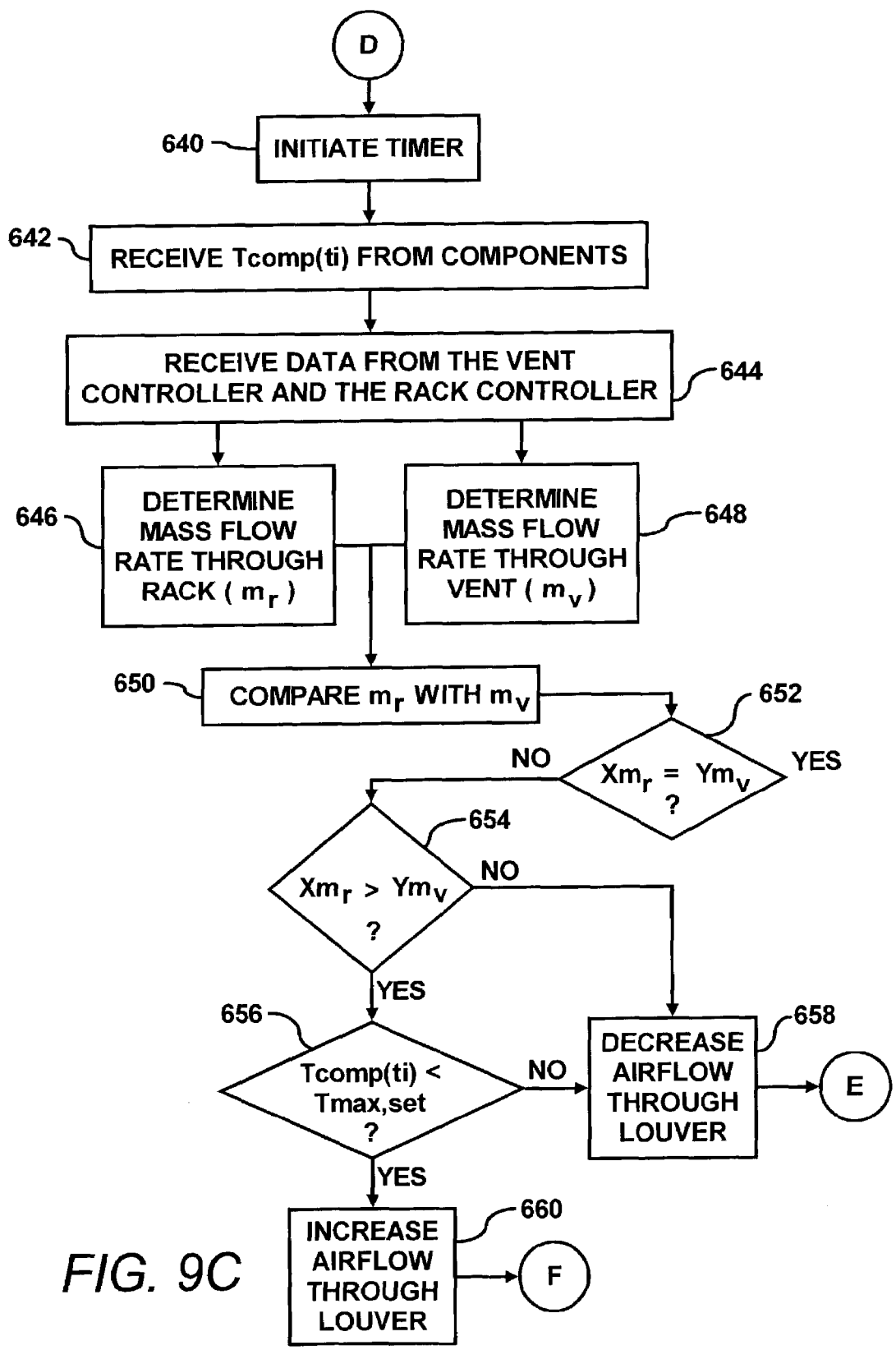

With reference now to FIG. 9C, the louver controller 104 may initiate the timer at step 640. At step 642, the louver controller 104 may receive the temperatures of the components at some time (ti). This is denoted as Tcomp(ti) in FIG. 9C. The louver controller 104 may perform steps 644–656 which are respectively equivalent to the steps 606–620 described hereinabove with respect to FIG. 9A. Due to their similarities, a description of steps 644–656 will not be set forth hereinbelow. Instead, the description of steps 606–620 is relied upon to provide adequate disclosure of steps 644–656.

At step 654, X times the mass flow rate of air through the rack is compared with Y times the mass flow rate of air through the vent. If X times the mass flow rate of air through the rack does not exceed Y times the mass flow rate of through the vent, the airflow through the louver may be decreased at step 658.

If X times the mass flow rate of air through the rack exceeds Y times the mass flow rate of air through the vent, the Tcomp(ti) may be compared with the Tmax,set as indicated at step 656. If the Tcomp(ti) exceeds the Tmax,set, the airflow through the louver may be decreased at step 658. Alternatively, if the Tcomp(ti) does not exceed the Tmax,set, the airflow through the louver may be increased at step 660.

Figure 9D:
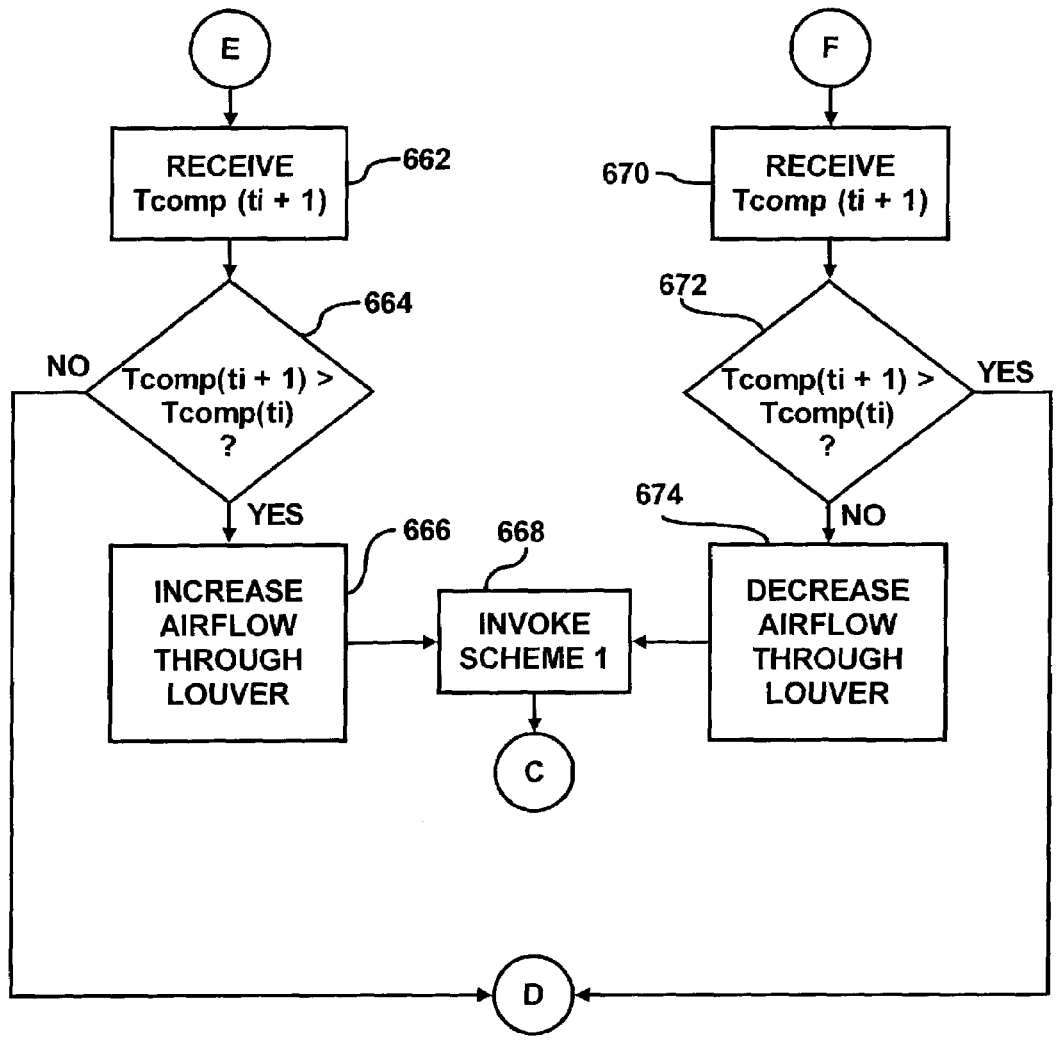

Following step 658, the temperatures of the components may be received at a second time (ti+1) at step 662 (FIG. 9D). The louver controller 104 may determine whether the decrease in airflow through the louver resulted in a increase in the component temperatures at step 664. This determination may be made by comparing Tcomp(ti+1) with Tcomp(ti). That is, the controller 104 may determine that the component temperatures rose if Tcomp(ti+1) exceeds Tcomp(ti). If the intended result of reducing the component temperatures occurred, e.g., Tcomp(ti+1) is less than Tcomp(ti), then the second control scheme (scheme 2) indicated as steps 640–660 may be repeated. According to the second control scheme, when the temperatures of the components exceed a predetermined maximum set point temperature, cooling fluid delivery is decreased to the components steps (604–658).

However, if the component temperatures have risen, e.g., Tcomp(ti+1) exceeds Tcomp(ti), the louver controller 104 may increase the airflow through the louver at step 666. Instead of operating under scheme 2, the louver controller 104 may operate under the first scheme (scheme 1) as indicated at step 668.

Following step 660, the temperatures of the components may be received at a second time (ti+1) at step 670. The louver controller 104 may determine whether the increase in airflow through the louver (step 660) resulted in an increase in the component temperatures at step 672. In this respect, the louver controller 104 may compare the Tcomp(ti+1) with the Tcomp(ti) to determine whether the cooling fluid delivery increase resulted in an increase in the temperatures of the components. If the Tcomp at (ti+1) is greater than the Tcomp at (ti), the second scheme (scheme 1) may be repeated by the louver controller 104.

If the temperatures of the components have been increased, e.g., Tcomp(ti+1) exceeds Tcomp(ti), the louver controller 104 may invoke the first scheme (scheme 1).

The first and second schemes may be repeated any number times, e.g., as long as the components 30 are operational, at predetermined time intervals, etc. Thus, the louver controller 104 may vary the cooling fluid delivery into the rack 10 and/or heated air exhaust from the rack 10 as conditions change in the rack 10. In addition, the louver controller 104 may vary the airflow through the rack 10 according to an iterative process. That is, the louver controller 104 may alter the airflow by a predetermined amount each time a change is warranted and repeat this process until the Tcomp's are within the predetermined operating temperature ranges.

According to an embodiment of the invention, the louver controller 104 may prevent the louvers from closing beyond a certain point to thus prevent a situation where the flow of cooling fluid through the rack 10 falls below a preset minimum. In other words, the louver controller 104 may stop the operational mode 200 at a certain point if it determines that the continued reduction in airflow through the rack 10 may result in damage to the components.

After the louver actuator(s) are manipulated to compensate for variances between the mass flow rates through the rack and the vent, steps 602–678 may be repeated substantially continuously. In this regard, the operational mode 600 may comprise an iterative process designed to monitor and vary the mass flow rates of airflow through racks to substantially reduce or prevent undesirable mixing of cooling fluid and heated air in a data center. By repeating the operational mode 600 a number of times, the mass flow rates through the rack and the vent may substantially be equalized.

Alternatively, the louver controller 104 may enter an idle state (step 602) and may re-initiate the operational mode 600 in response to the variety of stimuli described hereinabove.

As described in greater detail in the co-pending applications listed hereinabove, a computational fluid dynamics (CFD) tool may be implemented to monitor the temperature of air as well as the airflow in the data center 300. In one regard, the CFD tool may be implemented to produce a numerical model of environmental conditions within the data center 300 to thus determine the manner in which cooling fluid and heated air are flowing in the data center 300. For example, the temperature of the cooling fluid exhausting from one or more vents as well as the temperature of the heated air exhausting from one or more racks may be inputted into the CFD tool. In addition, the temperature of the air at various locations throughout the data center may also be inputted into the CFD tool. The CFD tool may use these temperatures to create a numerical model of the temperature distributions in the data center 300.

By comparing the numerical models of temperature distributions throughout the data center 300 at various times, the CFD tool may determine changes in temperature distribution in the data center 300. If the numerical models of the temperature distributions indicate that the cooling fluid is re-circulating with the heated air, the louver controller(s) 104 of various racks may manipulate one or more louvers to reduce or eliminate the re-circulation. Thus, for example, if the temperature of the heated air exiting one or more racks exceeds a predetermined temperature, the louvers of those racks may be manipulated to reduce the flow of cooling fluid therethrough to thereby reduce the temperature of the heated air exhausted from those racks.

As described in co-pending and commonly assigned application Ser. No. 10/345,723, filed on Jan. 22, 2003 and entitled "Agent Based Control Method and System for Energy Management", the disclosure of which is hereby incorporated by reference in its entirety, the louvered openings may be considered as resources that may be traded or allocated among rack agents to distribute cooling fluid. These resources may be at the lowest tier of the resource pyramid and may be allocated first in response to a control signal. The multi-tiered and multi-agent control system may be driven by appropriate environmental conditions, e.g., temperature, pressure, humidity, combinations thereof, etc., deviations arid the rack operating parameters.

By virtue of certain embodiments of the present invention, the amount of energy, and thus the costs associated with maintaining environmental conditions within a data center within predetermined operating parameters, may be substantially reduced. In one respect, by operating the cooling system to supply cooling fluid substantially only as needed by the components in the racks, the cooling system may be operated at a relatively more efficient manner in comparison with conventional cooling systems. Moreover, the temperature of the cooling fluid delivered to those components may be maintained at levels substantially equal to its temperature when it exits the vents. In addition, the temperature of the heated air delivered to an air conditioning system may also be maintained at levels substantially equal to its temperature when it exhausts from the racks. Therefore, cooling fluid may operate to remove heat from the components in the racks and the air conditioning unit may cool heated air in substantially more efficient manners over known cooing systems.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A system for cooling one or more electronic components in a rack, said system comprising:
    a louver assembly positioned to vary airflow through the rack;
    an actuator configured to manipulate the louver assembly;
    an inlet temperature sensor configured to detect the temperature of cooling fluid delivered into the rack;
    an outlet temperature sensor configured to detect the temperature of heated air exhausted from the rack; and
    a controller configured to operate the actuator substantially based on the temperatures detected by the inlet temperature sensor and the outlet temperature sensor to thereby vary the airflow through the louver assembly.

2. The system according to claim 1, further comprising:
    at least one electronic component temperature sensor, said at least one electronic component temperature sensor being in communication with said controller, and wherein said controller is further configured to operate the actuator substantially based on the temperature(s) of the one or more electronic components.

3. The system according to claim 2, further comprising:
    a memory associated with the controller, said controller being configured to access said memory to determine actuator operation based upon the detected temperatures.

4. The system according to claim 1, further comprising:
    a plurality of louver assemblies positioned at various locations of the rack, wherein said controller is configured to substantially independently control to plurality of louver assemblies to enable substantially varied airflow through the plurality of louver assemblies.

5. The system according to claim 1, further comprising:
    a component power draw sensor, said component power draw sensor being in communication with said controller, and wherein said controller is further configured to operate the actuator substantially based on the power draw of the one or more electronic components.

6. A method for cooling at least one electronic component housed in a rack, said method comprising:

receiving a sensed temperature of the at least one electronic component;
determining whether the sensed temperature is within a predetermined range;
determining whether the sensed temperature is above a predetermined maximum set point temperature;
manipulating a movable louver to increase delivery of a cooling fluid to the at least one electronic component in response to the sensed temperature being above the predetermined maximum set point temperature; and
manipulating a movable louver to decrease delivery of a cooling fluid to the at least one electronic component in response to the sensed temperature being below the predetermined maximum set point temperature.

7. The method according to claim 6, further comprising:
receiving a second sensed temperature of the at least one component;
comparing the second sensed temperature with the sensed temperature to determine whether a first manipulation of the movable louver resulted in an intended outcome; and
manipulating the movable louver in an opposite manner to the first manipulation in response to the first manipulation resulting in an unintended outcome.

8. The method according to claim 6, further comprising:
receiving sensed temperatures of a plurality of electronic components;
determining whether the sensed temperatures ore within a predetermined range; and
wherein said step of manipulating comprises manipulating a plurality of movable louvers in substantially independent manners in response to the sensed temperatures of the plurality of electronic components being outside of the predetermined range to thereby vary the flow of cooling fluid delivery to the plurality of electronic components.

9. A method for cooling at least one electronic component housed in a rack, said method comprising:
receiving a sensed temperature of the at least one electronic component;
determining whether the sensed temperature is within a predetermined range;
determining whether the sensed temperature is above a predetermined maximum set point temperature;
manipulating a movable louver to decrease delivery of a cooling fluid to the at least one electronic component in response to the sensed temperature being above the predetermined maximum set point temperature; and
manipulating a movable louver to increase deliver of a cooling fluid to the at least one electronic component in response to the sensed temperature being below the predetermined maximum set point temperature.

10. A system for cooling one or more electronic components in a rack, said system comprising:
means for sensing the temperature of the one or more electronic components;
means for determining whether the sensed temperature is within a predetermined range; and
means for manipulating the airflow through the rack in response to the sensed temperature of the one or more electronic components being outside of the predetermined range to thereby vary the flow of cooling fluid delivery to the one or more electronic components.

11. The system according to claim 10, further comprising:
means for determining whether the sensed temperature is above or below a predetermined maximum set point temperature;
means for increasing the cooling fluid delivery to the one or more electronic components in response to the sensed temperature being above the predetermined maximum set point temperature; and
means for decreasing the cooling fluid delivery to the one or more electronic components in response to the sensed temperature being below the predetermined maximum set point temperature.

12. The system according to claim 11, further comprising:
means for receiving a second sensed temperature of the at least one component means for comparing the second sensed temperature with the sensed temperature to determine whether a first manipulation of the movable louver resulted in an intended outcome; and
means for manipulating a movable louver in an opposite manner to the first manipulation in response to the first manipulation resulting in an unintended outcome.

13. The system according to claim 10, thither comprising:
means for determining whether the sensed temperature is above a predetermined maximum set point temperature;
means for decreasing the cooling fluid delivery to the at least one electronic component in response to the sensed temperature being above the predetermined maximum set point temperature; and
means for increasing the cooling fluid delivery to the at least one electronic component in response to the sensed temperature being below the predetermined maximum set point temperature.

14. The system according to claim 10, further comprising:
means for receiving sensed temperatures of the one or more electronic components;
means for determining whether the sensed temperature is within a predetermined range; and
means for manipulating a plurality of movable louvers in substantially independent manners in response to the sensed temperatures of the one or more electronic components being outside of to predetermined range to thereby vary to flow of cooling fluid delivery to the one or more electronic components.

15. A data center comprising:
a plurality of racks, each of said plurality of racks, having one or more movable louvers positioned on at least one of an inlet and an outlet of each of the plurality of racks;
a cooling system operable to supply said plurality of racks with cooling fluid to thereby cool electronic components located within the plurality of racks; and
a plurality of louver controllers configured to operate the one or more movable louvers to vary the supply of cooling fluid into the plurality of racks, said louver controllers being configured to operate the movable louvers to reduce re-circulation of the cooling fluid with air heated in the plurality of racks.

16. The data center according to claim 15, further comprising:
a mobile device configured to detect one or more environmental conditions in the data center; said mobile device being in communication with the louver controller, and wherein said louver controller is configured to operate the movable louvers in response to data received from the mobile device.

17. The data center according to claim 15, further comprising:
a return configured to receive heated air from the rack, wherein said louver controller is configured to manipulate the movable louvers to direct heated airflow in the general direction of the return.

18. The data center according to claim 15, further comprising:
a heat exchanger unit having an intake configured to receive heated air from the rack, a heat exchanger configured to cool the heated air, and n exhaust configured to supply the cooled air to the rack, wherein said louver controller is configured to manipulate movable louvers located on the outlet of the rack to direct heated airflow in the general direction of the intake and the louver controller is configured to manipulate movable louvers located on the inlet of the rack to receive cooled air from the exhaust.

19. A data center comprising:
a rack having one or more movable louvers positioned on at least one of an inlet and an outlet of the rack;
a cooling system operable to supply said rack with cooling fluid to thereby cool electronic components located within the rack, wherein said cooling system comprises a vent having a vent controller configured to determine airflow through said vent, said cooling system further comprising a pressure sensor configured to measure the pressure within a plenum positioned to supply cooling fluid to said vent; and
a louver controller configured to operate the one at more movable louvers to vary the supply of cooling fluid from the plenum into the rack.

20. The data center according to claim 19, wherein said louver controller is in communication with the vent controller and the pressure sensor, and wherein said louver controller is configured to operate the one or more movable louvers in response to data received from said vent controller and the pressure sensor.

21. The data center according to claim 19, wherein said rack comprises an inlet temperature sensor positioned to detect the temperature of air around the rack inlet and an outlet temperature sensor positioned to detect the temperature of air around the rack outlet, said rack further comprising a component temperature sensor positioned to detect the temperatures of one or more electronic components, wherein said louver controller is in communication with said inlet temperature sensor, said outlet temperature sensor, and said component temperature sensor, and wherein said louver controller is operable to operate the one or more movable louvers in response to data received from said inlet temperature sensor, said outlet temperature sensor, and said component temperature sensor.

22. The data center according to claim 19, wherein said rack comprises an electronic component power draw sensor positioned to detect the power supplied to the electronic components, wherein said louver controller is in communication with said component power draw sensor, and wherein said louver controller is operable to operate the one or more movable louvers in response to data received from said component power draw sensor.

23. A method of reducing re-circulation of air in a data center having at least one rack and at least one vent for supplying cooling fluid to the at least one rack, said at least one rack having one or more movable louvers, said method comprising:
determining the mass flow rate of airflow through the at least one rack;
determining the muss flow rate of airflow through the at least one vent;
computing the mass flow rate of airflow through the at least one rack and the at least one vent; and
manipulating the one or more movable louvers in response to the comparison of the mass flow rates through the at least one rack and the at least one vent to reduce re-circulation of air in the data center.

24. The method according to claim 23, wherein said step of determining the mass flow rate of airflow through the at least one rack comprises calculating the mass flow rate of airflow through the at least one rack bused on temperature measurements from a plurality of temperature sensors and power supply measurements from a power draw sensor.

25. The method according to claim 23, wherein said step of determining the mass flow rate of airflow through the at least one rack comprises measuring the mass flow rate of airflow through the at least one rack.

26. The method according to claim 23, wherein said step of determining the mass flow rate of airflow through the at least one vent comprises basing the determination of the mass flow rate of airflow through the at least one vein on information received from a vent controller and pressure measurements from a pressure sensor located in a cooling fluid supply plenum of the data center.

27. The method according to claim 23, further comprising:
determining a conversion factor to compare the mass flow rate of airflow through the at least one rack and the mass flow rate of airflow through the at least one vent, wherein the conversion further is based upon a substantially optimal mass flow rate difference that reduces or eliminates re-circulation of cooling fluid with heated air, and
wherein the step of comparing the mass flow rate of airflow through the at least one rack and the mass flow rate of airflow through the at least one vent comprises comparing the mass flow rates of airflow through the at least one rack and the at least one vent based upon the conversion factor.

28. The method according to claim 27, further comprising:
determining whether the converted mass flow rate of airflow trough the at least one rack is greater than the convened mass flow rate of airflow through the at least one vent; and
manipulating the one or more movable louvers in response to the convened mass flow rare of airflow through the at least one rack differing from the converted mass flow rate of the airflow through the at least one vent.

29. The method according to claim 28, further comprising:
increasing the mass flow rate of airflow through the at least one rack in response to the converted mass flow rate of the airflow through the vent exceeding the converted mass flow rate of the airflow through the rack.

30. The method according to claim 28, further comprising:
determining the temperatures of one or more components in to at least one rack;
determining whether the temperatures of the one or more components in the at least one rack is below a predetermined maximum temperature;
manipulating the one or more movable louvers to increase the mass flow rate of airflow through the rack in response to the temperatures of the one or more components exceeding the predetermined maximum temperature; and
manipulating the one or more movable louvers to decrease the mass flow rate of airflow through the rack in response to the temperatures of the one or more components falling below the predetermined maximum temperature.

31. The method according to claim 30, further comprising:
   receiving a second sensed temperature of the one or more components;
   comparing the second sensed temperature with the sensed temperature to determine whether a first manipulation of the one or more movable louvers resulted in an intended outcome; and
   manipulating the one or more movable louvers in an opposite manner to the first manipulation in response to the first manipulation resulting in an unintended outcome.

32. The method according to claim 28, further comprising:
   determining the temperatures of one or more components in the at least one rack;
   determining whether the temperatures of the one or more components in the at least one rack is below a predetermined maximum temperature;
   manipulating the one or more movable louvers to decrease the mass flow rate of airflow through the rack in response to the temperatures of the one or more components exceeding the predetermined maximum temperature; and
   manipulating the one or more movable louvers to increase the mass flow rate of airflow through the rack in response to the temperatures of the one or more components falling below the predetermined maximum temperature.

33. The method according to claim 23, further comprising:
   performing a numerical modeling of a temperature distribution and characteristics of airflow in the data center; and
   manipulating the one or more movable louvers in response to the numerical modeling to reduce re-circulation of airflow in the data center.

34. The method according to claim 23, further comprising:
   implementing a plurality of movable louvers of a plurality of racks as resources; and
   performing one or more of trading and allocating the resources as rack agents to distribute cooling fluid to a plurality of racks.

35. A computer readable storage medium on which is embedded one or more computer programs, said one or more computer programs implementing a method of reducing re-circulation of air in a data center having at least one rack and at least one vent for supplying cooling fluid to the at least one rack, said at least one rack having one or more movable louvers, said one or more computer programs comprising a set of instructions for:
   determining the muss flow rate of airflow through the at least one rack;
   determining the mass flow rate of airflow through the at least one vent;
   comparing the mass flow rate of airflow through the at least one rack and the at least one vent; and
   manipulating the one or more movable louvers in response to the comparison of the mass flaw rates through the at least one rack and the at least one vent to thereby reduce re-circulation of air in the data center.

36. The computer readable storage medium according to claim 35, said one or more computer programs further comprising a set of instructions for:
   determining a conversion factor to compare the mass flow rate of airflow through the at least one rack and the muss flow rate of airflow through the at least one vent, wherein the conversion factor is based upon a substantially optimal mass flow rate difference that reduces or eliminates re-circulation of cooling fluid with heated air, and
   wherein the step of comparing the mass flow rate of airflow through the at least one rack and the mass flow rate of airflow through the at least one vent comprises comparing the mass flow rates of airflow through the at least one rack and the at least one vent based upon the conversion factor.

37. The computer readable storage medium according to claim 36, said one or more computer programs further comprising a set of instructions for:
   determining whether the converted mass flow rate of airflow through the at least one rack is greater than the converted mass flow rate of airflow through the at least one vent; and
   manipulating the one or more movable louvers in response to the converted mass flow rate of airflow through the at least one rack differing from the converted mass flow rate of to airflow through the at least one vent.

38. The computer readable storage medium according to claim 37, said one or more computer programs further comprising a set of instructions for:
   increasing the mass flow rate of airflow trough the at least one rack in response to the converted mass flow rate of the airflow through the vent exceeding the converted mass flow rate of the airflow through the rack.

39. The computer readable storage medium according to claim 37, said one or more computer programs further comprising a set of instructions for:
   determining the temperatures of one or more components in the at least one rack;
   determining whether the temperatures of the one or more components in the at least one rack is below a predetermined maximum temperature;
   manipulating the one or more movable louvers to increase the mass flow rate of airflow through the rack in response to the temperatures of the one or more components exceeding the predetermined maximum temperature; and
   manipulating the one or more movable louvers to decrease the mass flow rate of airflow through the rack in response to the temperatures of the one or more components falling below the predetermined maximum temperature.

40. The computer readable storage medium according to claim 37, said one or more computer programs further comprising a set of instructions for:
   receiving a second sensed temperature of the one or more components;
   comparing the second sensed temperature with the sensed temperature to determine whether a first manipulation of the one or more movable louvers resulted in an intended outcome; and
   manipulating die one or more movable louvers in an opposite manner to the first manipulation in response to the first manipulation resulting in an unintended outcome.

41. The computer readable storage medium according to claim 35, said one or more computer programs further comprising a set of instructions for:
- determining the temperatures of one or more components in the at least one rack;
- determining whether the temperatures of the one or more components in the at least one rack is below a predetermined maximum temperature;
- manipulating the one or more movable louvers to decrease the mass flow rate of airflow through the rack in response to the temperatures of the one or more components exceeding the predetermined maximum temperature; and
- manipulating the one or more movable louvers to increase the mass flow rare of airflow through the rack in response to the temperatures of the one or more components falling below the predetermined maximum temperature.

* * * * *

UNITED STATES PATENT AND TRADEMARK OFFICE
CERTIFICATE OF CORRECTION

PATENT NO. : 7,031,154 B2  Page 1 of 3
APPLICATION NO. : 10/425621
DATED : April 18, 2006
INVENTOR(S) : Cullen Edwin Bash et al.

It is certified that error appears in the above-identified patent and that said Letters Patent is Title Pg, Item (56), under "U.S. Patent Documents", in column 2, line 2,
delete "5,497,873 A *    3/1996    Hay    40/564" and
insert -- 5,497,573    3/1996    Stadjuhar et al.    40/564 --, therefor.

In column 18, line 20, delete "locution" and insert -- location --, therefor.

In column 18, line 22, delete "manna" and insert -- manner --, therefor.

In column 19, line 44, delete "locution" and insert -- location --, therefor.

In column 20, line 21, delete "trucked" and insert -- tracked --, therefor.

In column 22, line 3, delete "S14" and insert -- 514 --, herefor.

In column 27, line 64, delete "arid" and insert -- and --, therefor.

In column 28, line 57, in Claim 4, after "control" delete "to" and insert -- the --, therefor.

In column 29, line 28, in Claim 8, delete "ore" and insert -- are --, therefor.

In column 29, line 49, in Claim 9, delete "deliver" and insert -- delivery --, therefor.

In column 30, line 11, in Claim 12, after "component" insert -- ; --.

In column 30, line 18, in Claim 13, delete "thither" and insert -- further --, therefor.

In column 30, line 38, in Claim 14, after "of" delete "to" and insert -- the --, therefor.

In column 30, line 39, in Claim 14, after "vary" delete "to" and insert -- the --, therefor.

In column 30, line 42, in Claim 15, after "racks" delete ",".

UNITED STATES PATENT AND TRADEMARK OFFICE
CERTIFICATE OF CORRECTION

PATENT NO.        : 7,031,154 B2
APPLICATION NO. : 10/425621
DATED             : April 18, 2006
INVENTOR(S)       : Cullen Edwin Bash et al.

It is certified that error appears in the above-identified patent and that said Letters Patent is hereby corrected as shown below:

In column 31, line 5, in Claim 18, delete "n" and insert -- an --, therefor.

In column 31, line 24, in Claim 19, delete "at" and insert -- or --, therefor.

In column 31, line 62, in Claim 23, delete "muss" and insert -- mass --, therefor.

In column 31, line 64, in Claim 23, delete "computing" and insert -- comparing --, therefor.

In column 32, line 6, in Claim 24, delete "bused" and insert -- based --, therefor.

In column 32, line 16, in Claim 26, delete "vein" and insert -- vent --, therefor.

In column 32, line 25, in Claim 27, delete "further" and insert -- factor --, therefor.

In column 32, line 38, in Claim 28, delete "trough" and insert -- through --, therefor.

In column 32, line 39, in Claim 28, delete "convened" and insert -- converted --, therefor.

In column 32, line 42, in Claim 28, delete "convened" and insert -- converted --, therefor.

In column 32, line 42, in Claim 28, delete "rare" and insert -- rate --, therefor.

In column 32, line 57, in Claim 30, delete "to" and insert -- the --, therefor.

In column 33, line 58, in Claim 35, delete "muss" and insert -- mass --, therefor.

In column 33, line 65, in Claim 35, delete "flaw" and insert -- flow --, therefor.

In column 34, line 6, in Claim 36, delete "muss" and insert -- mass --, therefor.

UNITED STATES PATENT AND TRADEMARK OFFICE
CERTIFICATE OF CORRECTION

PATENT NO. : 7,031,154 B2
APPLICATION NO. : 10/425621
DATED : April 18, 2006
INVENTOR(S) : Cullen Edwin Bash et al.

It is certified that error appears in the above-identified patent and that said Letters Patent is hereby corrected as shown below:

In column 34, line 27, in Claim 37, delete "to" and insert -- the --, therefor.

In column 34, line 32, in Claim 38, delete "trough" and insert -- through --, therefor.

In column 34, line 64, in Claim 40, delete "die" and insert -- the --, therefor.

In column 36, line 5, in Claim 41, delete "rare" and insert -- rate --, therefor.

Signed and Sealed this

Twenty-fifth Day of August, 2009

David J. Kappos
*Director of the United States Patent and Trademark Office*